(12) United States Patent
Park et al.

(10) Patent No.: US 12,279,481 B2
(45) Date of Patent: Apr. 15, 2025

(54) DISPLAY DEVICE WITH ROW OF LEDS BETWEEN BANKS

(71) Applicant: Samsung Display Co., LTD., Yongin-si (KR)

(72) Inventors: No Kyung Park, Hwaseong-si (KR); Hyun Kim, Seoul (KR); Do Yeong Park, Hwaseong-si (KR); Jeong Su Park, Asan-si (KR); Myeong Hun Song, Pyeongtaek-si (KR); Jeong Kook Wang, Hwaseong-si (KR); Jong Chan Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 656 days.

(21) Appl. No.: 17/500,462

(22) Filed: Oct. 13, 2021

(65) Prior Publication Data

US 2022/0262877 A1   Aug. 18, 2022

(30) Foreign Application Priority Data

Feb. 18, 2021   (KR) .................. 10-2021-0021613

(51) Int. Cl.
*H01L 27/32*   (2006.01)
*H01L 27/15*   (2006.01)
*H10K 59/122*   (2023.01)

(52) U.S. Cl.
CPC ......... *H10K 59/122* (2023.02); *H01L 27/156* (2013.01)

(58) Field of Classification Search
CPC ........................... H10K 59/122; H01L 27/156
See application file for complete search history.

(56) References Cited

U.S. PATENT DOCUMENTS

2008/0251381 A1*  10/2008  Shibata .................. C25D 13/02
                                                 204/483
2013/0027623 A1*   1/2013  Negishi ............... H01L 25/0753
                                                  438/30

(Continued)

FOREIGN PATENT DOCUMENTS

KR   10-2018-0055021       5/2018
KR   10-2019-0121894      10/2019

(Continued)

OTHER PUBLICATIONS

International Search Report corresponding to International Application No. PCT/KR2022/002251 dated May 25, 2022.

(Continued)

*Primary Examiner* — Peter Bradford
(74) *Attorney, Agent, or Firm* — KILE PARK REED & HOUTTEMAN PLLC

(57) ABSTRACT

A display device includes a first electrode and a second electrode extending in a first direction and spaced apart from each other in a second direction, a first insulating layer disposed on the first electrode and the second electrode, a bank layer disposed on the first insulating layer and comprising an outer bank part extending in the first direction and the second direction and inner bank parts extending in the first direction in an area surrounded by the outer bank part, a second insulating layer disposed on the inner bank parts and the first insulating layer, and light emitting elements disposed on the second insulating layer between the inner bank parts, wherein each of the inner bank parts is connected to a part of the outer bank part extending in the second direction.

20 Claims, 21 Drawing Sheets

(56) References Cited

U.S. PATENT DOCUMENTS

| | | | |
|---|---|---|---|
| 2013/0168708 A1* | 7/2013 | Shibata | H01L 24/95 |
| | | | 257/88 |
| 2017/0358563 A1* | 12/2017 | Cho | H01L 33/38 |
| 2018/0012876 A1* | 1/2018 | Kim | H01L 33/387 |
| 2018/0019369 A1* | 1/2018 | Cho | H01L 33/38 |
| 2018/0138157 A1 | 5/2018 | Im et al. | |
| 2019/0019930 A1* | 1/2019 | Do | H01L 24/95 |
| 2019/0115513 A1* | 4/2019 | Im | H05K 1/111 |
| 2019/0296200 A1 | 9/2019 | Im et al. | |
| 2019/0326348 A1 | 10/2019 | Im et al. | |
| 2020/0203583 A1 | 6/2020 | Im et al. | |
| 2021/0134768 A1* | 5/2021 | Lee | H01L 25/167 |
| 2021/0159250 A1* | 5/2021 | Chang | H01L 25/0753 |
| 2021/0193734 A1 | 6/2021 | Im et al. | |
| 2021/0193885 A1 | 6/2021 | Im et al. | |
| 2022/0037397 A1* | 2/2022 | Li | H01L 33/62 |
| 2022/0077228 A1* | 3/2022 | Do | H01L 25/0753 |
| 2022/0102423 A1* | 3/2022 | Kim | H01L 27/156 |
| 2022/0123026 A1 | 4/2022 | Oh et al. | |

FOREIGN PATENT DOCUMENTS

| | | |
|---|---|---|
| KR | 10-2020-0006209 | 1/2020 |
| KR | 10-2020-0088954 | 7/2020 |
| KR | 20200088954 A * | 7/2020 |
| KR | 10-2020-0102607 | 9/2020 |
| KR | 10-2020-0105598 | 9/2020 |
| KR | 10-2021-0005453 | 1/2021 |
| KR | 10-2021-0057891 | 5/2021 |

OTHER PUBLICATIONS

Written Opinion corresponding to International Application No. PCT/KR2022/002251, dated May 25, 2022.

* cited by examiner

DISPLAY DEVICE WITH ROW OF LEDS BETWEEN BANKS

CROSS-REFERENCE TO RELATED APPLICATION(S)

This application claims priority to and the benefit of Korean Patent Application No. 10-2021-0021613 under 35 U.S.C. § 119, filed on Feb. 18, 2021, in the Korean Intellectual Property Office (KIPO), the entire contents of which are incorporated herein by reference.

BACKGROUND

1. Technical Field

The disclosure relates to a display device.

2. Description of the Related Art

Display devices are becoming increasingly important with the development of multimedia. Accordingly, various types of display devices such as organic light emitting displays and liquid crystal displays are being used.

As a device for displaying an image of a display device, there is a self-luminous display device including alight emitting element. The self-luminous display device may be an organic light emitting display using an organic material as a light emitting material as a light emitting element or an inorganic light emitting display using an inorganic material as a light emitting material.

SUMMARY

Aspects of the disclosure provide a display device having a novel stacked structure.

However, aspects of the disclosure are not restricted to the one set forth herein. The above and other aspects of the disclosure will become more apparent to one of ordinary skill in the art to which the disclosure pertains by referencing the detailed description of the disclosure given below.

A display device according to an embodiment includes an insulating layer disposed between a bank layer including an organic material and electrodes. Therefore, it is possible to prevent the electrodes from being damaged by a developer of the bank layer in a process of forming the bank layer.

It should be noted that the effects of the disclosure are not limited to those described above, and other effects of the disclosure will be apparent from the following description.

According to an embodiment of the disclosure, a display device may comprise a first electrode and a second electrode extending in a first direction and spaced apart from each other in a second direction, a first insulating layer disposed on the first electrode and the second electrode, a bank layer disposed on the first insulating layer and comprising an outer bank part extending in the first direction and the second direction and inner bank parts extending in the first direction in an area surrounded by the outer bank part, a second insulating layer disposed on the inner bank parts and the first insulating layer, and light emitting elements disposed on the second insulating layer between the inner bank parts, wherein each of the inner bank parts is connected to a part of the outer bank part extending in the second direction.

The inner bank parts may comprise a first inner bank part disposed on the first electrode, and a second inner bank part disposed on the second electrode and spaced apart from the first inner bank part in the second direction, and the second insulating layer may comprise a first pattern part disposed in a first main area between the first inner bank part and the second inner bank part, in a first subarea between the first inner bank part and a part of the outer bank part extending in the first direction, in a second subarea between the second inner bank part and the part of the outer bank part extending in the first direction, and on the inner bank parts. A part of the first pattern part may be disposed directly on side surfaces of the outer bank part surrounding the first main area, the first subarea, and the second subarea.

The display device may further comprise holes which penetrate the first insulating layer and the second insulating layer. The holes may comprise a first hole disposed in the first subarea and a second hole disposed in the second subarea.

The display device may further comprise a third insulating layer disposed on the bank layer, the second insulating layer, and the light emitting elements and exposing ends of each of the light emitting elements. A part of the third insulating layer may be disposed in each of the first hole and the second hole.

A gap between the first inner bank part and the second inner bank part may be greater than a gap between the first electrode and the second electrode.

Ends of each of the light emitting elements may be disposed on the first electrode and the second electrode in the first main area, respectively.

The display device may further comprise a first electrode contact hole disposed in a part of the first electrode overlapping the part of the outer bank part extending in the second direction, and a second electrode contact hole disposed in a part of the second electrode overlapping the part of the outer bank part extending in the second direction.

The display device may further comprise a third subarea which is surrounded by the outer bank part and is spaced apart in the first direction from an area in which the light emitting elements are disposed, wherein a part of the first insulating layer may be disposed in the third subarea, and the second insulating layer may comprise a second pattern part disposed in the third subarea and on the side surfaces of the outer bank part surrounding the third subarea.

The display device may further comprise a first contact part disposed in the third subarea and penetrates the first insulating layer and the second insulating layer to expose a part of the first electrode, and a second contact part disposed in the third subarea and penetrates the first insulating layer and the second insulating layer to expose a part of the second electrode. A part of the first electrode and a part of the second electrode may be disposed in the third subarea.

The display device may further comprise a first connection electrode disposed on the first electrode, extending in the first direction, and electrically contacting the first electrode in the first contact part, and a second connection electrode disposed on the second electrode extending in the first direction, and electrically contacting the second electrode in the second contact part. Each of the first connection electrode and the second connection electrode may electrically contact the light emitting elements.

The display device may further comprise an opening disposed in the third subarea and penetrating the first insulating layer and the second insulating layer. The first electrode and the second electrode may be not disposed in the opening.

The outer bank part may comprise a plasma area disposed on an upper surface on which the second insulating layer is not disposed.

The display device may further comprise a third electrode disposed between the first electrode and the second electrode, and a fourth electrode spaced apart in the second direction from the third electrode with the second electrode disposed between the third and fourth electrodes. The inner bank parts may comprise a first inner bank part disposed on the first electrode, a second inner bank part disposed on the fourth electrode, and a third inner bank part disposed on the second electrode and the third electrode between the first inner bank part and the second inner bank part.

The light emitting elements may comprise first light emitting elements disposed on the first electrode and the third electrode in a first main area between the first inner bank part and the third inner bank part, and second light emitting elements disposed on the second electrode and the fourth electrode in a second main area between the third inner bank part and the second inner bank part.

According to an embodiment of the disclosure, a display device may include a first electrode and a second electrode disposed on a first substrate, a first insulating layer disposed on the first electrode and the second electrode, a first inner bank part and a second inner bank part disposed on the first insulating layer and disposed on the first electrode and the second electrode, respectively, an outer bank part disposed on the first insulating layer and surrounding the first inner bank part and the second inner bank part, a second insulating layer disposed on the first insulating layer, the first inner bank part, and the second inner bank part, light emitting elements disposed between the first inner bank part and the second inner bank part and each comprising ends, at least one of the ends being disposed on the first electrode or the second electrode, a third insulating layer disposed on the second insulating layer and the light emitting elements, and exposing the ends of each of the light emitting elements, a first connection electrode disposed on the first electrode and electrically contacting an end of each of the light emitting elements, and a second connection electrode disposed on the second electrode and electrically contacting another end of each of the light emitting elements.

The display device may further comprise may further include holes disposed between the first and second inner bank parts and the outer bank par, and penetrating the first insulating layer and the second insulating layer. The second insulating layer may be disposed in an area between the first inner bank part and the outer bank part and an area between the second inner bank part and the outer bank part, and the display device.

The third insulating layer may be disposed in the holes.

A part of the second insulating layer may be disposed directly on side surfaces of the outer bank part.

The outer bank part may comprise a plasma area disposed on an upper surface on which the second insulating layer is not disposed.

The second insulating layer may comprise a first layer, and a second layer disposed on the first layer and including a material having a different refractive index from a material of the first layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
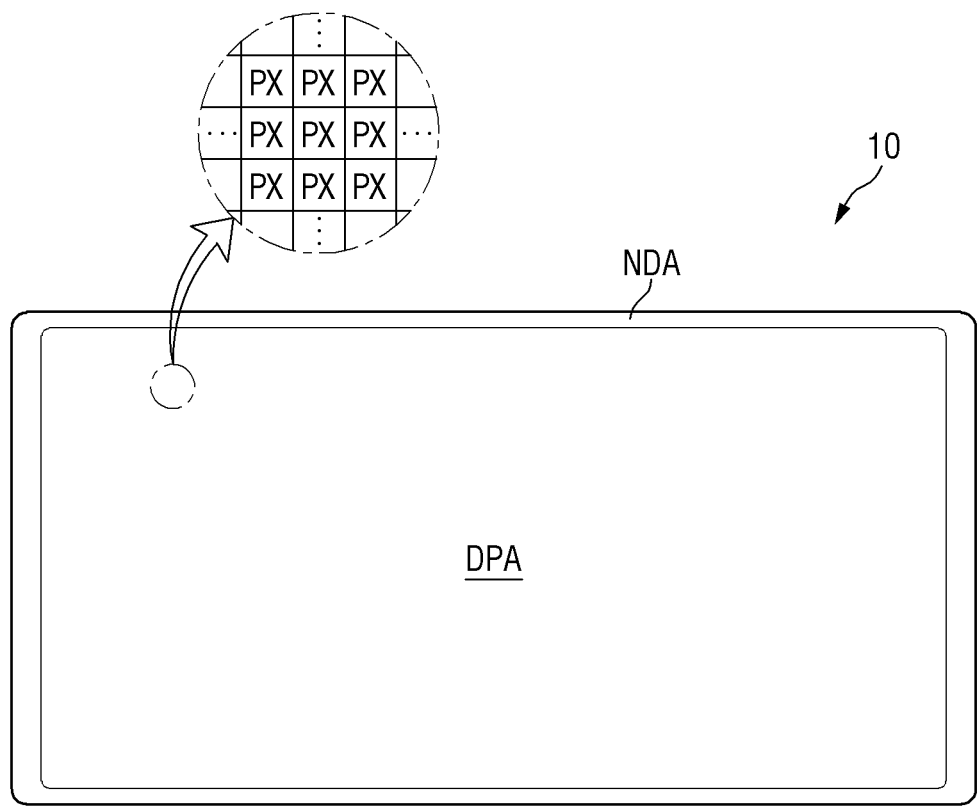
FIG. 1 is a schematic plan view of a display device according to an embodiment.
Figure 1:
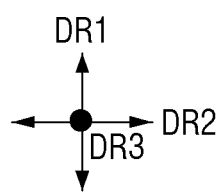

FIG. 1 is a schematic plan view of a display device 10 according to an embodiment.

Referring to FIG. 1, the display device 10 displays moving images or still images. The display device 10 may refer to any electronic device that provides a display screen. Examples of the display device 10 may include televisions, laptop computers, monitors, billboards, Internet of things (IoT) devices, mobile phones, smartphones, tablet personal computers (PCs), electronic watches, smartwatches, watchphones, head-mounted displays, mobile communication terminals, electronic notebooks, electronic books, portable multimedia players (PMPs), navigation devices, game machines, and digital cameras and camcorders, all of which provide a display screen.

The display device 10 includes a display panel that provides a display screen. Examples of the display panel include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited thereto, and other display panels can also be applied as long as the same technical spirit is applicable.

The shape of the display device 10 can be variously modified. For example, the display device 10 may have various shapes such as a horizontally long rectangle, a vertically long rectangle, a square, a quadrangle with rounded corners (vertices), other polygons, and a circle. The shape of a display area DPA of the display device 10 may also be similar to the overall shape of the display device 10. In FIG. 1, the display device 10 is shaped like a rectangle that is long in a second direction DR2.

The display device 10 may include the display area DPA and a non-display area NDA. The display area DPA may be an area where an image can be displayed, and the non-display area NDA may be an area where an image is not displayed. The display area DPA may also be referred to as an active area, and the non-display area NDA may also be referred to as an inactive area. The display area DPA may generally occupy the center of the display device 10.

The display area DPA may include pixels PX. The pixels PX may be arranged in a matrix direction. Each of the pixels PX may be rectangular or square in a plan view. However, the disclosure is not limited thereto, and each of the pixels PX may also have a rhombic shape having each side inclined with respect to a direction. The pixels PX may be arranged in a stripe type or a PENTILE™ type. Each of the pixels PX may include one or more light emitting elements which emit light of a specific wavelength band to display a specific color.

The non-display area NDA may be disposed around the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
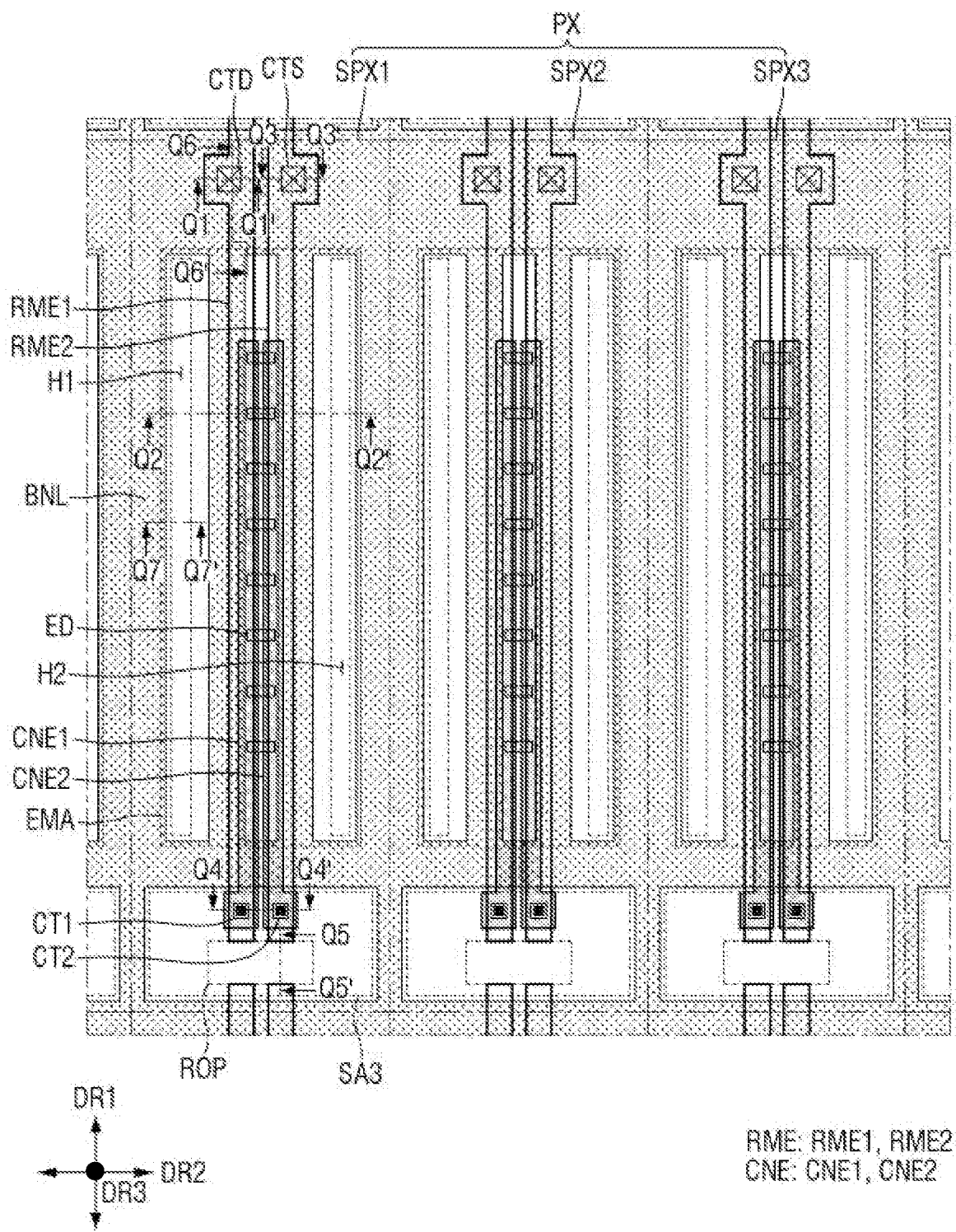
FIG. 2 is a schematic plan view of a pixel of the display device according to the embodiment.

FIG. 2 is a schematic plan view of a pixel PX of the display device 10 according to the embodiment.

Referring to FIG. 2, each of the pixels PX of the display device 10 may include subpixels SPXn (where n is 1 to 3). For example, a pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red. However, the disclosure is not limited thereto, and the subpixels SPXn may also emit light of the same color. In an embodiment, the subpixels SPXn may emit blue light. Although one pixel PX includes three subpixels SPXn in the drawing, the disclosure is not limited thereto, and the pixel PX may also include a greater number of subpixels SPXn.

Each subpixel SPXn of the display device 10 may include an emission area EMA and a non-emission area. The emission area EMA may be an area in which light emitting elements ED are disposed to emit light of a specific wavelength band. The non-emission area may be an area in which the light emitting elements ED are not disposed and from which no light is output because light emitted from the light emitting elements ED does not reach this area.

The emission area may include an area in which the light emitting elements ED are disposed and an area which is adjacent to the light emitting elements ED and to which light emitted from the light emitting elements ED is output. However, the disclosure is not limited thereto, and the emission area EMA may also include an area from which light emitted from the light emitting elements ED is output after being reflected or refracted by other members. Light emitting elements ED may be disposed in each subpixel SPXn, and an area where the light emitting elements ED are disposed and an area adjacent to this area may form the emission area EMA.

Although the respective emission areas EMA of the subpixels SPXn have substantially the same area in the drawing, the disclosure is not limited thereto. In some embodiments, the emission area EMA of each subpixel SPXn may have a different area according to the color or wavelength band of light emitted from the light emitting elements ED disposed in the corresponding subpixel SPXn.

The subpixels SPXn may be separated by a bank layer BNL, and a subpixel SPXn may include areas surrounded by the bank layer BNL. The bank layer BNL may be disposed in a grid pattern in the entire display area DPA by including parts extending in a first direction DR1 and the second direction DR2 in a plan view. The bank layer BNL may include outer bank parts EB (see FIG. 4) including parts extending in the first direction DR1 and the second direction DR2 and inner bank parts IB (see FIG. 4) disposed in an area surrounded by the outer bank parts EB. The outer bank parts EB may be disposed at the boundaries of different subpixels SPXn to separate neighboring subpixels SPXn. A gap between the subpixels SPXn may vary according to a width of the outer bank parts EB. The outer bank parts EB of the bank layer BNL may divide a subpixel SPXn into two areas and may divide the subpixel SPXn into areas MA1, SA1, SA2 and SA3 (see FIG. 4) together with the inner bank parts IB. This will be described below with reference to other drawings.

Figure 3:
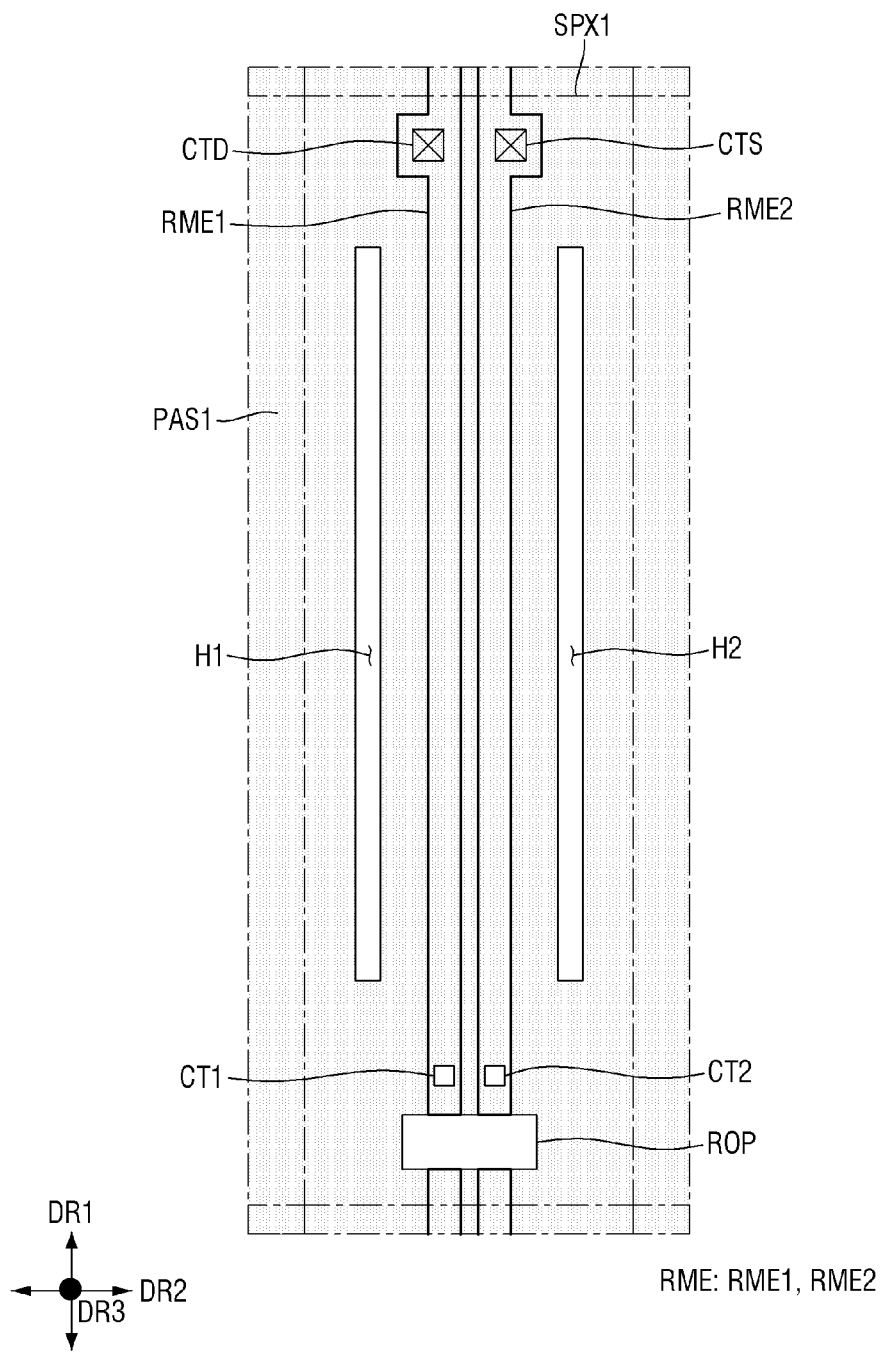
FIG. 3 is a schematic plan view illustrating the relative arrangement of electrodes and a first insulating layer in a first subpixel of FIG. 2.
Figure 4:
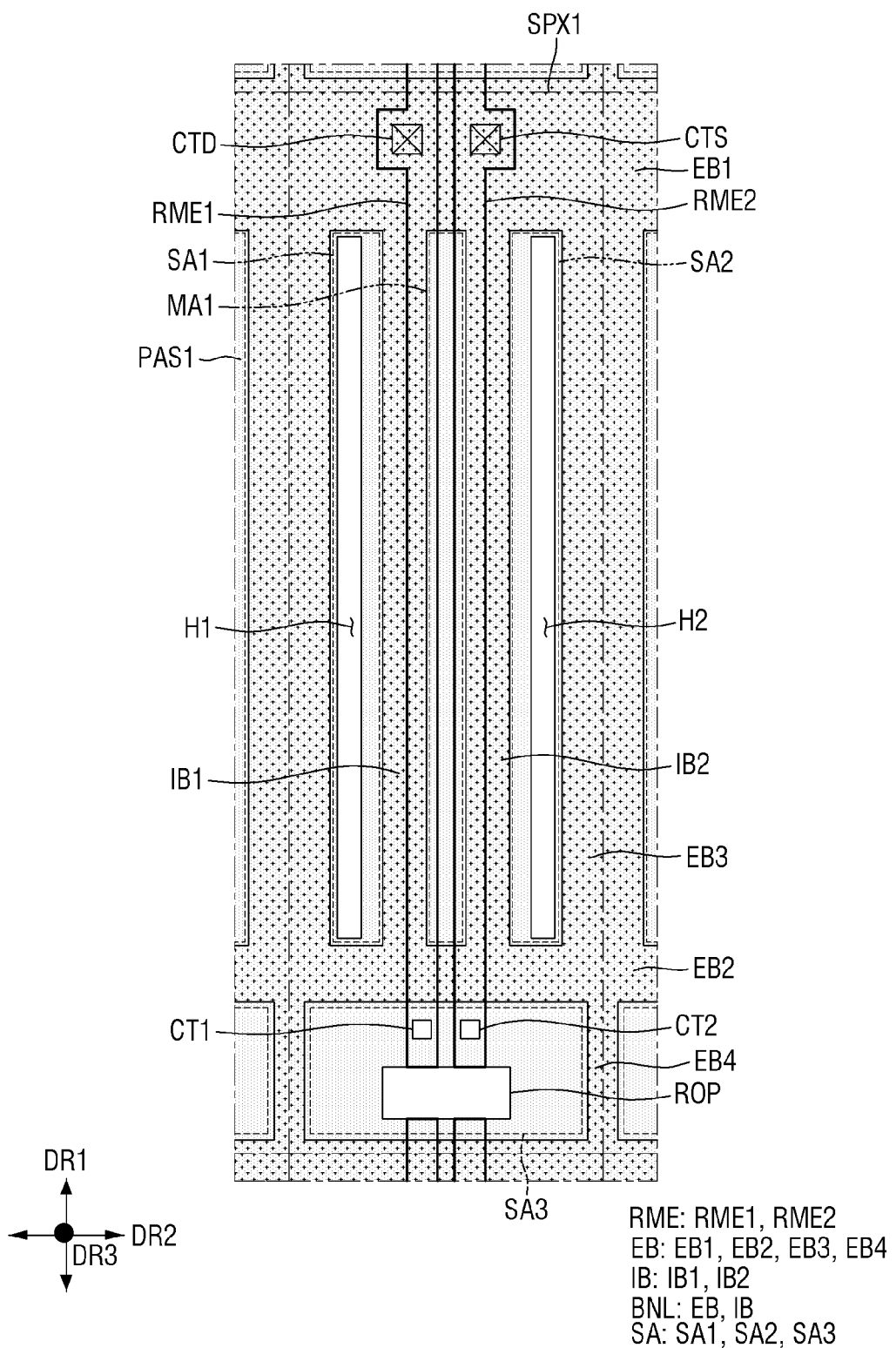
FIG. 4 is a schematic plan view illustrating the relative arrangement of the electrodes, the first insulating layer, and a bank layer in the first subpixel of FIG. 2.
Figure 5:
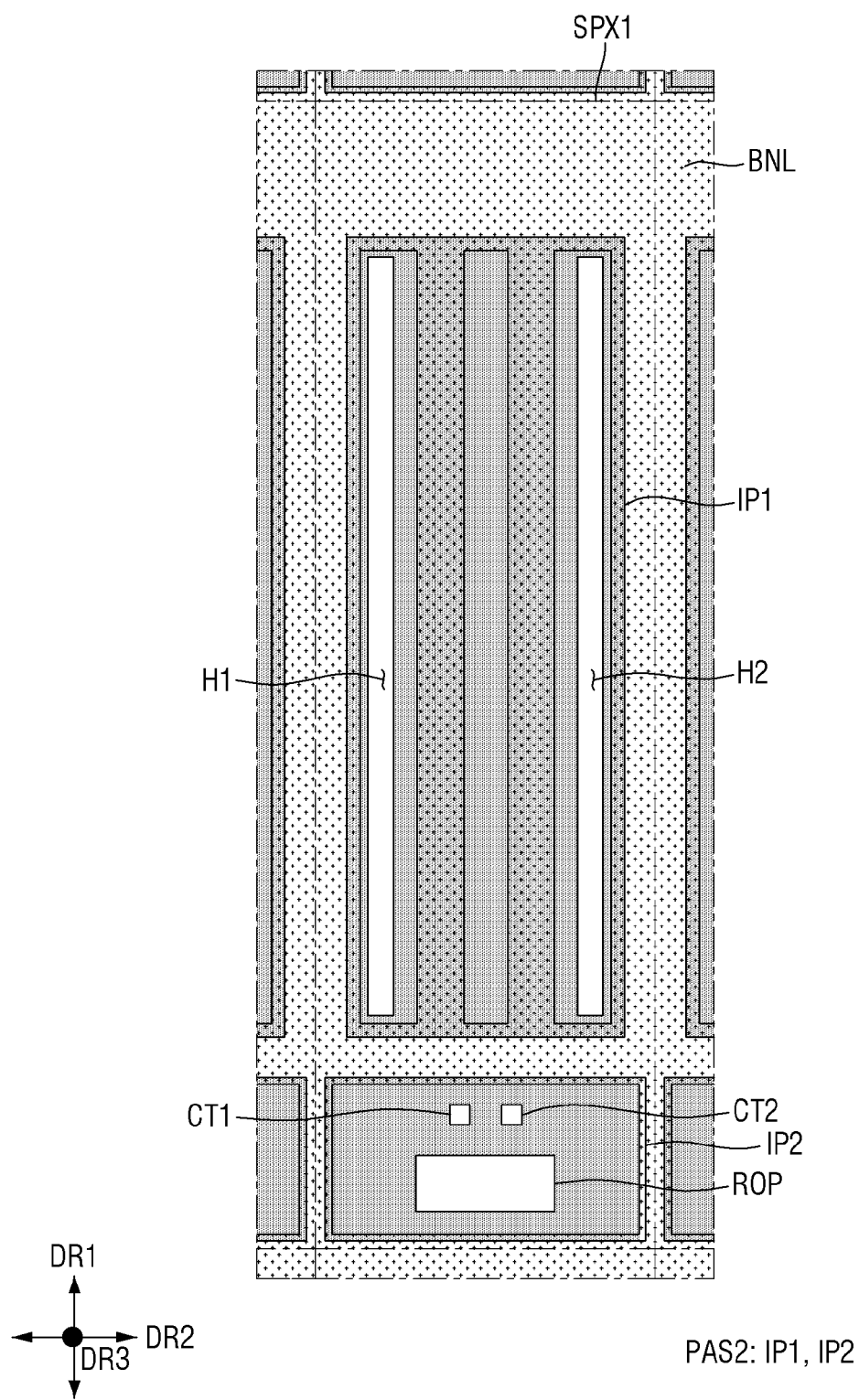
FIG. 5 is a schematic plan view illustrating the relative arrangement of the bank layer and a second insulating layer in the first subpixel of FIG. 2.
Figure 6:
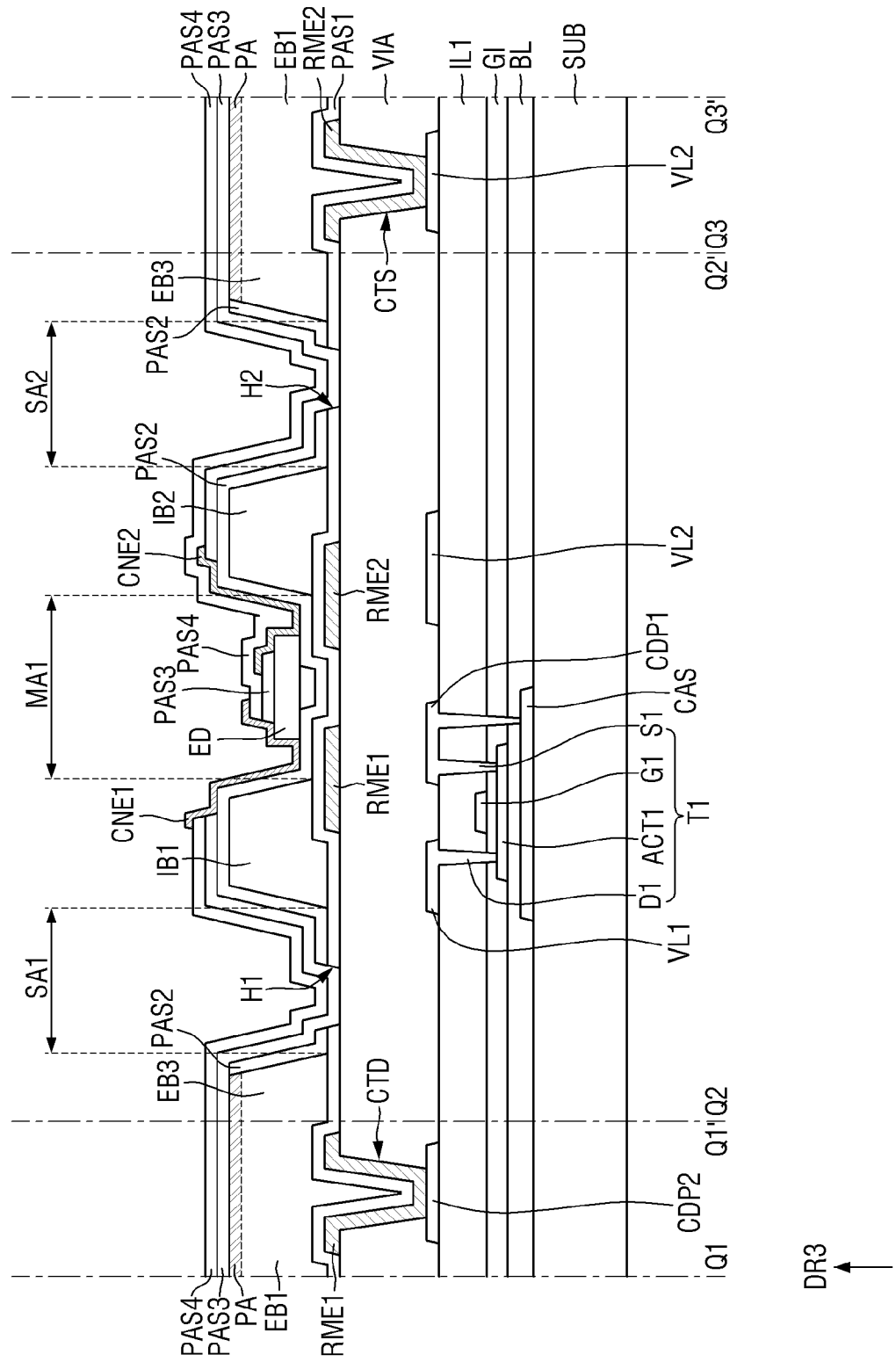
FIG. 6 is a schematic cross-sectional view taken along lines Q1-Q1', Q2-Q2' and Q3-Q3' of FIG. 2.
Figure 7:
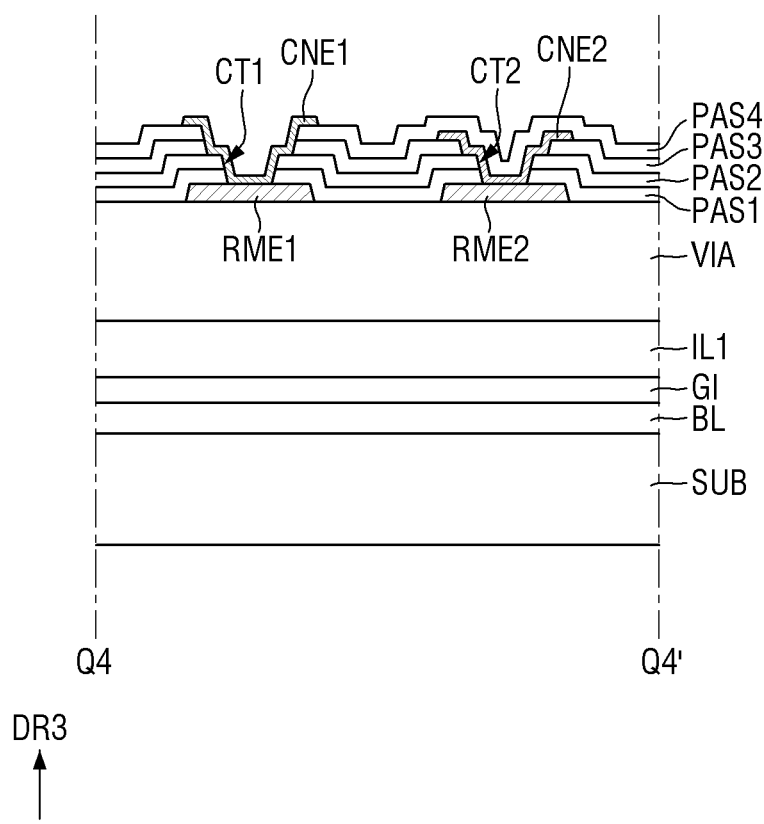
FIG. 7 is a schematic cross-sectional view taken along line Q4-Q4' of FIG. 2.
Figure 8:
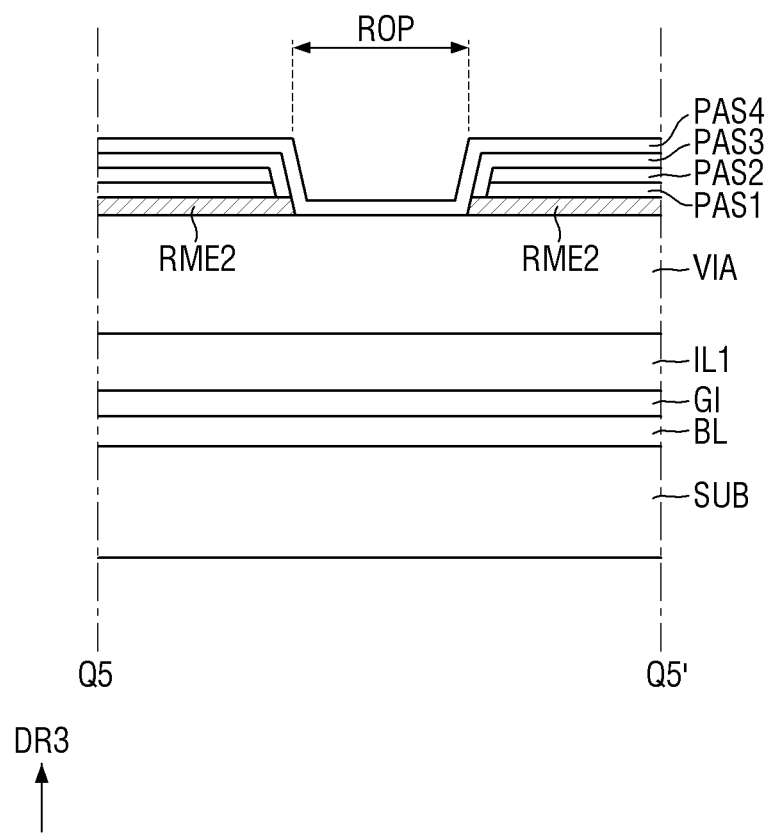
FIG. 8 is a schematic cross-sectional view taken along line Q5-Q5' of FIG. 2.

FIG. 3 is a schematic plan view illustrating the relative arrangement of electrodes RME and a first insulating layer PAS1 in the first subpixel SPX1 of FIG. 2. FIG. 4 is a schematic plan view illustrating the relative arrangement of the electrodes RME, the first insulating layer PAS1, and the bank layer BNL in the first subpixel SPX1 of FIG. 2. FIG. 5 is a schematic plan view illustrating the relative arrangement of the bank layer BNL and a second insulating layer PAS2 in the first subpixel SPX1 of FIG. 2. FIG. 6 is a schematic cross-sectional view taken along lines Q1-Q1', Q2-Q2', and Q3-Q3' of FIG. 2. FIG. 7 is a schematic cross-sectional view taken along line Q4-Q4' of FIG. 2. FIG. 8 is a schematic cross-sectional view taken along line Q5-Q5' of FIG. 2.

FIGS. 3 to 5 illustrate only some of layers disposed in the first subpixel SPX1. FIG. 6 illustrates a cross section across both ends of a light emitting element ED disposed in the first subpixel SPX1, and FIGS. 7 and 8 respectively illustrate cross sections across contact parts CT1 and CT2 and a separation part ROP disposed in a third subarea SA3 of the first subpixel SPX1.

Referring to FIGS. 3 to 7 in conjunction with FIG. 2, the display device 10 may include a first substrate SUB and a semiconductor layer, conductive layers and insulating layers disposed on the first substrate SUB. The semiconductor layer, the conductive layers, and the insulating layers may form (or constitute) a circuit layer and a display element layer of the display device 10.

Specifically, the first substrate SUB may be an insulating substrate. The first substrate SUB may be made of an insulating material such as glass, quartz, or polymer resin. The first substrate SUB may be a rigid substrate, but may also be a flexible substrate that can be bent, folded, rolled, etc.

A first conductive layer may be disposed on the first substrate SUB. The first conductive layer includes a bottom metal layer CAS, and the bottom metal layer CAS is overlapped by (or overlaps) an active layer ACT1 of a first transistor T1. The bottom metal layer CAS may include a light blocking material to prevent light from entering the active layer ACT1 of the first transistor T1. However, the bottom metal layer CAS may be omitted.

A buffer layer BL may be disposed on the bottom metal layer CAS and the first substrate SUB. The buffer layer BL may be formed on the first substrate SUB to protect transistors of the pixels PX from moisture introduced through the first substrate SUB which is vulnerable to moisture penetration, and may perform a surface planarization function.

The semiconductor layer is disposed on the buffer layer BL. The semiconductor layer may include the active layer ACT1 of the first transistor T1. The active layer ACT1 may overlap a gate electrode G1 of a second conductive layer which will be described below.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although one first transistor T1 is disposed in each subpixel SPXn of the display device 10 in the drawings, the disclosure is not limited thereto. The display device 10 may include a greater number of transistors.

A first gate insulating layer GI is disposed on the semiconductor layer and the buffer layer BL. The first gate insulating layer GI may serve as a gate insulating film of the first transistor T1.

The second conductive layer is disposed on the first gate insulating layer GI. The second conductive layer may include the gate electrode G1 of the first transistor T1. The gate electrode G1 may overlap a channel region of the active layer ACT1 in a third direction DR3, which is a thickness direction.

A first interlayer insulating layer IL1 is disposed on the second conductive layer. The first interlayer insulating layer IL1 may function as an insulating film between the second conductive layer and other layers disposed on the second conductive layer and may protect the second conductive layer.

A third conductive layer is disposed on the first interlayer insulating layer IL1. The third conductive layer may include a first voltage line VL1, a second voltage line VL2, and conductive patterns CDP1 and CDP2, for example, first and second conductive pattern CDP1 and CDP2.

A high-potential voltage (or a first power supply voltage) supplied to a first electrode RME1 may be applied to the first voltage line VL1, and a low-potential voltage (or a second power supply voltage) supplied to a second electrode RME2 may be applied to the second voltage line VL2. A part of the first voltage line VL1 may contact the active layer ACT1 of the first transistor T1 through a contact hole penetrating the first interlayer insulating layer IL1 and the first gate insulating layer GI. The first voltage line VL1 may serve as a first drain electrode D1 of the first transistor T1. The second voltage line VL2 may be directly connected to the second electrode RME2 which will be described below.

A first conductive pattern CDP1 may contact the active layer ACT1 of the first transistor T1 through a contact hole penetrating the first interlayer insulating layer IL1 and the first gate insulating layer GI. The first conductive pattern CDP1 may contact the bottom metal layer CAS through another contact hole. The first conductive pattern CDP1 may serve as a first source electrode Si of the first transistor T1.

A second conductive pattern CDP2 may be electrically connected to the first electrode RME1 to be described below. The second conductive pattern CDP2 may be electrically connected to the first transistor T1 through the first conductive pattern CDP1. In the drawings, the first conductive pattern CDP1 and the second conductive pattern CDP2 are separated from each other. However, in some embodiments, the second conductive pattern CDP2 may be integral with the first conductive pattern CDP1 to form a pattern. The first transistor T1 may send the first power supply voltage received from the first voltage line VL1 to the first electrode RME1.

Although the first conductive pattern CDP1 and the second conductive pattern CDP2 are formed on the same layer in the drawings, the disclosure is not limited thereto. In some embodiments, the second conductive pattern CDP2 may be formed on a different conductive layer from the first conductive pattern CDP1, for example, may be formed on a fourth conductive layer disposed on the third conductive layer with some insulating layers interposed therebetween. In this case, the first voltage line VL1 and the second voltage line VL2 may also be made of (or include) the fourth conductive layer instead of the third conductive layer, and the first voltage line VL1 may be electrically connected to the drain electrode D1 of the first transistor T1 through another conductive pattern.

Each of the buffer layer BL, the first gate insulating layer GI, and the first interlayer insulating layer IL1 described above may be composed of inorganic layers stacked alternately. For example, each of the buffer layer BL, the first gate insulating layer GI, and the first interlayer insulating layer IL1 may be a double layer in which inorganic layers including at least one of silicon oxide ($SiO_x$), silicon nitride ($SiN_x$), and silicon oxynitride ($SiO_xN_y$) are stacked or may be a multi-layer in which the inorganic layers are alternately stacked. However, the disclosure is not limited thereto, and each of the buffer layer BL, the first gate insulating layer GI, and the first interlayer insulating layer IL1 may also be one inorganic layer including any of the above insulating materials. In some embodiments, the first interlayer insulating layer IL1 may be made of an organic insulating material such as polyimide (PI).

Each of the second conductive layer and the third conductive layer may be, but is not limited to, a single layer or a multi-layer made of one or more of molybdenum (Mo), aluminum (Al), chromium (Cr), gold (Au), titanium (Ti), nickel (Ni), neodymium (Nd), and copper (Cu), and alloys thereof.

A via layer VIA is disposed on the third conductive layer. The via layer VIA may include an organic insulating material such as polyimide (PI) and perform a surface planarization function.

Electrodes RME, the bank layer BNL, light emitting elements ED, and connection electrodes CNE, for example, first and second connection electrodes CNE1 and CNE2, are disposed as the display element layer on the via layer VIA. Insulating layers PAS1 to PAS4, for example, first to fourth insulating layers PAS1 to PAS4, may be disposed on the via layer VIA.

The electrodes RME extend in a direction and are disposed in each subpixel SPXn. The electrodes RME may extend in the first direction DR1, may be disposed in the emission area EMA of each subpixel SPXn, and may be spaced from each other in the second direction DR2. The electrodes RME may be electrically connected to the light emitting elements ED. Each of the electrodes RME may be electrically connected to the light emitting elements ED by a connection electrode CNE, for example, first or second connection electrode CNE1 or CNE2, to be described below and may send an electrical signal, received from a conductive layer disposed thereunder, to the light emitting elements ED.

The display device 10 includes the first electrode RME1 and the second electrode RME2 disposed in each subpixel SPXn. The first electrode RME1 is disposed on a left side of the center of the emission area EMA, and the second electrode RME2 is spaced from the first electrode RME1 in the second direction DR2 and disposed on a right side of the center of the emission area EMA.

As described above, a subpixel SPXn may be divided into areas by the bank layer BNL. In an embodiment, each subpixel SPXn may include the emission area EMA and the third subarea SA3 as areas surrounded by the outer bank parts EB. The third subarea SA3 may be disposed below the emission area EMA, for example, on the other side (or another side) of the emission area EMA in the first direction DR1 and may be disposed between the emission areas EMA of subpixels SPXn neighboring in the first direction DR1. For example, emission areas EMA and third subareas SA3 may be repeatedly arranged in the second direction DR2 but may be alternately arranged in the first direction DR1. However, the disclosure is not limited thereto, and the arrangement of the emission areas EMA and the third subareas SA3 in pixels PX may also be different from that in FIG. 2. Light is not output from the third subarea SA3 because the light emitting elements ED are not disposed in the third subarea SA3, but a part of each of the electrodes RME disposed in each subpixel SPXn may be disposed in the third subarea SA3. The first electrode RME1 and the second electrode RME2 may extend in the first direction DR1 across the emission area EMA and the third subarea SA3. In the separation part ROP of the third subarea SA3, each of the electrodes RME may be separated from another electrode RME of a subpixel SPXn neighboring in the first direction DR1.

The first electrode RME1 and the second electrode RME2 may be disposed on the via layer VIA. In an embodiment, the first electrode RME1 and the second electrode RME2 may be directly disposed on the via layer VIA and may be electrically connected to the third conductive layer through contact holes penetrating the via layer VIA. For example, a first electrode contact hole CTD penetrating the via layer VIA may be formed in a part in which the first electrode RME1 overlaps an outer bank part EB disposed above the emission area EMA.

The first electrode RME1 may contact the second conductive pattern CDP2 of the third conductive layer through the first electrode contact hole CTD. Similarly, a second electrode contact hole CTS penetrating the via layer VIA may be formed in a part in which the second electrode RME2 overlaps the outer bank part EB disposed above the emission area EMA. The second electrode RME2 may contact the second voltage line VL2 of the third conductive layer through the second electrode contact hole CTS. The first electrode RME1 may be electrically connected to the first transistor T1 by the second conductive pattern CDP2 to receive the first power supply voltage, and the second electrode RME2 may be electrically connected to the second voltage line VL2 to receive the second power supply voltage. Although the first electrode contact hole CTD and the second electrode contact hole CTS are disposed under the outer bank part EB in the drawings, the disclosure is not limited thereto. Each of the electrode contact holes CTD and CTS may also be disposed in the emission area EMA or the third subarea SA3.

Each of the electrodes RME may include a conductive material having high reflectivity. For example, each of the electrodes RME may include a metal such as silver (Ag), copper (Cu), or aluminum (Al) as a material having high reflectivity or may be an alloy including aluminum (Al), nickel (Ni), or lanthanum (La). Each of the electrodes RME may reflect light, which travels toward side surfaces of the bank layer BNL after being emitted from the light emitting elements ED, in an upward direction of each subpixel SPXn.

However, the disclosure is not limited thereto, and each electrode RME may further include a transparent conductive material. For example, each electrode RME may include a material such as ITO, IZO, or ITZO. In some embodiments, each electrode RME may have a structure in which at least one layer formed of a transparent conductive material and at least one layer formed of a metal layer having high reflectivity are each stacked or may be formed as a single layer including them. For example, each electrode RME may have a stacked structure of ITO/Ag/ITO, ITO/Ag/IZO, or ITO/Ag/ITZO/IZO.

The first insulating layer PAS1 is disposed on the via layer VIA and the electrodes RME. The first insulating layer PAS1 may protect the electrodes RME while insulating them from each other. In particular, the first insulating layer PAS1 may be disposed to cover (or overlap) the electrodes RME before the bank layer BNL is formed, thereby preventing the electrodes RME from being damaged in a process of forming the bank layer BNL. The first insulating layer PAS1 may prevent the light emitting elements ED, disposed on the first insulating layer PAS1, from directly contacting other members and thus being damaged.

In an embodiment, the first insulating layer PAS1 may be stepped such that a part of an upper surface of the first insulating layer PAS1 is depressed between the electrodes RME spaced apart from each other in the second direction DR2. The light emitting elements ED may be disposed on the stepped upper surface of the first insulating layer PAS1, and a space may be formed between each of the light emitting elements ED and the first insulating layer PAS1.

In an embodiment, the first insulating layer PAS1 may be entirely disposed on the via layer VIA but may include openings partially exposing layers under the first insulating layer PAS1. For example, the first insulating layer PAS1 may include contact parts CT1 and CT2 partially exposing upper surfaces of the electrodes RME, respectively. The contact parts CT1 and CT2 may penetrate the first insulating layer PAS1 to partially expose the upper surfaces of the electrodes RME, and the connection electrodes CNE to be described below may contact the electrodes RME exposed through the contact parts CT1 and CT2. The first insulating layer PAS1 may expose an upper surface of the via layer VIA in the separation part ROP in which the electrodes RME of different subpixels SPXn are separated from each other. The contact parts CT1 and CT2 of the first insulating layer PAS1 and an opening of the separation part ROP may be disposed in the third subarea SA3. In an embodiment, the first insulating layer PAS1 may include holes H1 and H2, for example, first and second holes H1 and H2, exposing the upper surface of the via layer VIA in the emission area EMA. The holes H1 and H2 may be disposed or formed in areas between the inner bank parts IB and the outer bank parts EB in the emission area EMA surrounded by the outer bank parts EB.

As will be described below, the openings formed in the first insulating layer PAS1 may be formed by patterning the first insulating layer PAS1 together with the second insulating layer PAS2 disposed on the first insulating layer PAS1. During a process of manufacturing the display device 10, after the first insulating layer PAS1, the bank layer BNL, and the second insulating layer PAS2 are formed, an area in which the first insulating layer PAS1 and the second insulating layer PAS2 overlap may be partially patterned to form the contact parts CT1 and CT2, the holes H1 and H2, and the opening of the separation part ROP. This will be described in detail below.

The bank layer BNL may be disposed on the first insulating layer PAS1. The bank layer BNL may include parts extending in the first direction DR1 and the second direction DR2 and may be divided into the outer bank parts EB and the inner bank parts IB based on an area occupied by each subpixel SPXn.

The outer bank parts EB of the bank layer BNL may include a first outer bank part EB1 and a second outer bank part EB2 extending in the second direction DR2 and a third outer bank part EB3 and a fourth outer bank part EB4 extending in the first direction DR1 in a plan view. The outer bank parts EB may be formed in a grid pattern in the entire display area DPA and may separate the subpixels SPXn and the emission area EMA and the third subarea SA3 of each subpixel SPXn.

In a subpixel SPXn, the first outer bank part EB1 is disposed above the emission area EMA, and the second outer bank part EB2 is disposed below the emission area EMA and above the third subarea SA3. The first outer bank part EB1 and the second outer bank part EB2 may be spaced apart from each other in the first direction DR1 and may be alternately and repeatedly arranged. A width of the first outer bank part EB1 measured in the first direction DR1 may be greater than a width of the second outer bank part EB2, but the disclosure is not limited thereto. The third outer bank part EB3 may be disposed on both sides of the emission area EMA in the second direction DR2, and the fourth outer bank part EB4 may be disposed on both sides of the third subarea SA3 in the second direction DR2. Each of the third outer bank part EB3 and the fourth outer bank part EB4 may be repeatedly arranged in the second direction DR2. A width of the third outer bank part EB3 measured in the second direction DR2 may be greater than width of the fourth outer bank part EB4, but the disclosure is not limited thereto.

The first outer bank part EB1, the third outer bank part EB3, and the fourth outer bank part EB4 may separate different subpixels SPXn and may be disposed at the boundaries of the different subpixels SPXn. An area surrounded by the first outer bank part EB1, the third outer bank part EB3, and the second outer bank part EB2 may be the emission area EMA of a subpixel SPXn, and the light emitting elements ED may be disposed in the area. An area surrounded by the second outer bank part EB2, the fourth outer bank part EB4, and the first outer bank part EB1 may be the third subarea SA3 of the subpixel SPXn and may be the non-emission area in which the light emitting elements ED are not disposed.

The inner bank parts IB may extend in the first direction DR1 in the emission area EMA and may be connected to the first outer bank part EB1 and the second outer bank part EB2. The inner bank parts IB may include a first inner bank part IB1 located on the left side of the center of the emission area EMA and a second inner bank part IB2 spaced apart from the first inner bank part IB1 in the second direction DR2. The first inner bank part IB1 and the second inner bank part IB2 may cross the emission area EMA in the first direction DR1 and may be connected to the inside of the first outer bank part EB1 and the second outer bank part EB2, respectively. The first inner bank part IB1 may partially overlap the first electrode RME1, and the second inner bank part IB2 may partially overlap the second electrode RME2. In an embodiment, a gap between the first inner bank part IB1 and the second inner bank part IB2 may be greater than a gap between the first electrode RME1 and the second electrode RME2, and light emitting elements ED may be disposed between the inner bank parts IB. The inner bank parts IB may have the same width. However, the disclosure is not limited thereto, and some inner bank parts may also have a different width from that of other inner bank parts.

The outer bank parts EB and the inner bank parts IB of the bank layer BNL may be integral with each other to form a layer and may be distinguished by their relative positions. An area occupied by a subpixel SPXn may be defined as a specific area according to the arrangement of the electrodes RME, and the bank layer BNL may be disposed in a specific pattern corresponding to the area occupied by the subpixel SPXn. Of the bank layer BNL, parts disposed at the boundaries of different subpixels SPXn or surrounding an area in which the light emitting elements ED are disposed may be the outer bank parts EB, and parts disposed within the subpixel SPXn may be the inner bank parts IB.

Since the inner bank parts IB and the outer bank parts EB of the bank layer BNL are integral with each other, opening areas surrounded by the inner bank parts IB and the outer bank parts EB may be formed in a subpixel SPXn. In an embodiment, a subpixel SPXn may include a first main area MA1 between the inner bank parts IB, a first subarea SA1 and a second subarea SA2 between the inner bank parts IB and the outer bank parts EB, and the third subarea SA3 between the outer bank parts EB.

The first main area MA1 may be an area disposed between the first inner bank part IB1 and the second inner bank part IB in the emission area EMA and may be an area surrounded by the inner bank parts IB, the first outer bank part EB1, and the second outer bank part EB2. A part of each electrodes RME and the light emitting elements ED may be disposed in the first main area MA1.

The first subarea SA1 may be an area disposed between the first inner bank part IB1 and the third outer bank part EB3 in the emission area EMA, and the second subarea SA2 may be an area disposed between the second inner bank part IB2 and the third outer bank part EB3 in the emission area EMA. The first subarea SA1 and the second subarea SA2 may each be an area surrounded by any of the inner bank parts IB, the first outer bank part EB1, the second outer bank part EB2, and the third outer bank part EB3 and may be spaced apart from each other in the second direction DR2. The light emitting elements ED are not disposed in the first subarea SA1 and the second subarea SA2, and the holes H1 and H2 may be disposed.

The third subarea SA3 may be an area surrounded by the second outer bank part EB2, the fourth outer bank part EB4, and the first outer bank part EB1 and may be spaced from the emission area EMA or the first main area MA1 in the first direction DR1. The contact parts CT1 and CT2 and the separation part ROP may be disposed in the third subarea SA3. The display device 10 includes opening areas surrounded by the bank layer BNL in each subpixel SPXn, and specific members forming the subpixel SPXn may be disposed in each opening area.

The bank layer BNL may have a predetermined height (or thickness) from the first insulating layer PAS1, and at least a part of the bank layer BNL may protrude from the upper surface of the via layer VIA. The protruding part of the bank layer BNL may have inclined or curved side surfaces. Unlike in the drawings, each element of the bank layer BNL may have a semicircular or elliptical shape with a curved outer surface in a cross-sectional view. The outer bank parts EB of the bank layer BNL may prevent ink from overflowing into adjacent subpixels SPXn in an inkjet printing process during the process of manufacturing the display device 10. The outer bank parts EB may prevent inks, sprayed to different subpixels SPXn and including different types of light emitting elements ED, from being mixed with each other. The bank layer BNL may include, but is not limited to, an organic insulating material such as polyimide (PI).

The second insulating layer PAS2 may be disposed on the first insulating layer PAS1 and a part of the bank layer BNL. In an embodiment, the second insulating layer PAS2 may be disposed to correspond to the emission area EMA and the third subarea SA3 of each subpixel SPXn. For example, the second insulating layer PAS2 may include a first pattern part IP1 disposed in the emission area EMA and a second pattern part IP2 disposed in the third subarea SA3. The first pattern part IP1 and the second pattern part IP2 may be spaced apart from each other in the first direction DR1 by the second outer bank part EB2. First pattern parts IP1 and second pattern parts IP2 may be repeatedly arranged in the second direction DR2 and may be alternately arranged in the first direction DR1.

The first pattern part IP1 may be disposed in the emission area EMA of each subpixel SPXn, and the second pattern part IP2 may be disposed in the third subarea SA3 of each subpixel SPXn. The first pattern part IP1 may cover (or overlap) the first main area MA1, the first subarea SA1, and the second subarea SA2 and may also be directly disposed on the inner bank parts IB. Since the second insulating layer PAS2 is not disposed on the outer bank parts EB but is disposed in the emission area EMA and the third subarea SA3 of each subpixel SPXn, it may form an island-like pattern in the entire display area DPA.

However, each pattern part IP1 or IP2 of the second insulating layer PAS2 may be disposed in an opening area surrounded by the outer bank parts EB, and a part of the pattern part IP1 or IP2 may be directly disposed on side surfaces of the outer bank parts EB. In an embodiment, a part of the second insulating layer PAS2 may contact the side surfaces of the outer bank parts EB. The second insulating layer PAS2 may be disposed on side surfaces of the first outer bank part EB1 and the second outer bank part EB2 under which the electrodes RME are disposed among the outer bank parts EB. Accordingly, the electrodes RME disposed under the first outer bank part EB1 and the second outer bank part EB2 may be completely covered (or overlapped) by the second insulating layer PAS2. In the drawings, the second insulating layer PAS2 is disposed on the side surfaces of each outer bank part EB. However, the disclosure is not limited thereto. In some embodiments, the second insulating layer PAS2 may not be disposed on side surfaces of the third outer bank part EB3 under which the electrodes RME are not disposed among the outer bank parts EB and may be disposed only on side surfaces of other outer bank parts EB.

Similar to the first insulating layer PAS1, the second insulating layer PAS2 may include openings exposing layers under the second insulating layer PAS2. In an embodiment, the first pattern part IP1 of the second insulating layer PAS2 may include the holes H1 and H2 disposed in the first subarea SA1 and the second subarea SA2, and the second pattern part IP2 may include the contact parts CT1 and CT2 and the opening of the separation part ROP formed in the third subarea SA3.

A first hole H1 penetrating the first insulating layer PAS1 and the first pattern part IP1 of the second insulating layer PAS2 may be disposed in the first subarea SA1, and a second hole H2 penetrating the first insulating layer PAS1 and the first pattern part IP1 of the second insulating layer PAS2 may be disposed in the second subarea SA2. Each of the first hole H1 and the second hole H2 may extend in the first direction DR1 along the third outer bank part EB3. The first insulating layer PAS1 and the second insulating layer PAS2 may not be disposed in the first hole H1 and the second hole H2, the upper surface of the via layer VIA may be partially exposed by the first hole H1 and the second hole H2, and a third insulating layer PAS3 to be described below may be directly disposed on the exposed upper surface of the via layer VIA. The first hole H1 and the second hole H2 may serve as passages through which gas generated from the via layer VIA made of an organic insulating material or an organic insulating material layer under the via layer VIA, escapes during the process of manufacturing the display device 10. In an embodiment, a width WH of each of the first hole H1 and the second hole H2 measured in the second direction DR2 may be smaller than a length of each light emitting element ED. For example, the width WH of each of the first hole H1 and the second hole H2 measured in the second direction DR2 may be in a range of about 0.1 μm to about 5 μm or about 2 μm. Since the gas generated from the via layer VIA or the organic insulating material layer under the via layer VIA can fully escape before a process of forming an insulating layer on the first insulating layer PAS1 and the second insulating layer PAS2, the third insulating layer PAS3 and a fourth insulating layer PAS4 can be disposed in the holes H1 and H2. However, the disclosure is not limited thereto, and at least one of the third insulating layer PAS3 and the fourth insulating layer PAS4 may not be disposed in the holes H1 and H2.

A first contact part CT1 and a second contact part CT2 respectively overlapping the electrodes RME are disposed in the third subarea SA3. The first contact part CT1 may penetrate the first insulating layer PAS1 and the second insulating layer PAS2 to expose a part of the first electrode RME1, and the second contact part CT2 may penetrate the first insulating layer PAS1 and the second insulating layer PAS2 to expose a part of the second electrode RME2. An opening penetrating the first insulating layer PAS1 and the second insulating layer PAS2 may be disposed in the separation part ROP of the third subarea SA3, and the electrodes RME may not be disposed in the opening to partially expose the upper surface of the via layer VIA. The fourth insulating layer PAS4 to be described below may be directly disposed on the upper surface of the via layer VIA exposed in the opening of the separation part ROP.

Light emitting elements ED may be disposed on the second insulating layer PAS2. Each of the light emitting elements ED may extend in a direction and may be disposed such that the extending direction of the light emitting element ED is parallel to the first substrate SUB. As will be described below, each light emitting element ED may include semiconductor layers disposed in the extending direction, and the semiconductor layers may be sequentially disposed in a direction parallel to an upper surface of the first substrate SUB. However, the disclosure is not limited thereto. In case that the light emitting elements ED have a different structure, the layers may be disposed in a direction perpendicular to the first substrate SUB.

The light emitting elements ED may be disposed between the inner bank parts IB and on the electrodes RME spaced apart in the second direction DR2. The length of each light emitting element ED may be greater than the gap between the electrodes RME spaced in the second direction DR2. Each light emitting element ED may be disposed such that at least one end is disposed on any one of different electrodes RME, or both ends lie on the different electrodes RME, respectively. The direction in which each electrode RME extends and the direction in which the light emitting elements ED extend may be substantially perpendicular to each other. The light emitting elements ED may be spaced from each other in the first direction DR1 in which each electrode RME extends, and may be aligned substantially parallel to each other. However, the disclosure is not limited thereto, and the light emitting elements ED may also be disposed obliquely with respect to the direction in which each electrode RME extends.

The light emitting elements ED disposed in each subpixel SPXn may emit light of different wavelength bands according to the material that forms the semiconductor layers described above. However, the disclosure is not limited thereto, and the light emitting elements ED disposed in each subpixel SPXn may also emit light of the same color by including the semiconductor layers made of the same material. The light emitting elements ED may be electrically connected to the electrodes RME and to the conductive layers under the via layer VIA by contacting the connection electrodes CNE (CNE1 and CNE2) and may emit light of a specific wavelength band in response to an electrical signal.

The third insulating layer PAS3 may be disposed on the light emitting elements ED, the second insulating layer PAS2, and the bank layer BNL. The third insulating layer PAS3 may include a pattern part extending in the first direction DR1 between the inner bank parts IB and disposed on the light emitting elements ED. The pattern part may partially surround outer surfaces of the light emitting elements ED and may not cover (or overlap) both sides or both ends of the light emitting elements ED. The pattern part may form a linear or island pattern in each subpixel SPXn in a plan view. The pattern part of the third insulating layer PAS3 may protect the light emitting elements ED while fixing the light emitting elements ED during the process of manufacturing the display device 10. The third insulating layer PAS3 may fill a space between each of the light emitting elements ED and the second insulating layer PAS2 under the light emitting elements ED. A part of the third insulating layer PAS3 may be disposed on the bank layer BNL and in the subareas SA1 to SA3.

In an embodiment, the third insulating layer PAS3 may cover (or overlap) the first hole H1 and the second hole H2 penetrating the first insulating layer PAS1 and the second insulating layer PAS2 and may directly contact the upper surface of the via layer VIA in the first hole H1 and the second hole H2. The third insulating layer PAS3 may be formed in a process performed after openings penetrating the first insulating layer PAS1 and the second insulating layer PAS2 are formed, and may be disposed in the first hole H1 and the second hole H2 within the emission area EMA. On the other hand, the third insulating layer PAS3 may not be disposed in the contact parts CT1 and CT2 of the third subarea SA3 and the opening of the separation part ROP. A part of the third insulating layer PAS3 which exposes the opening of the separation part ROP may be utilized as a mask in a process of separating the electrodes RME. The third insulating layer PAS3 may be entirely disposed on the second insulating layer PAS2 and the bank layer BNL but may be patterned to expose both ends of each light emitting element ED, the contact parts CT1 and CT2, and the opening of the separation part ROP.

Connection electrodes CNE (CNE1 and CNE2) may be disposed on the electrodes RME and the light emitting elements ED and may contact them. For example, a connection electrode CNE may contact one end of each light emitting element ED and contact at least one of the electrodes RME through the contact part CT1 or CT2 penetrating the first insulating layer PAS1 and the second insulating layer PAS2.

A first connection electrode CNE1 may extend in the first direction DR1 and may be disposed on the first electrode RME1. A part of the first connection electrode CNE1 which is disposed on the first inner bank part IB1 may overlap the first electrode RME1, and the first connection electrode CNE1 may extend from the part in the first direction DR1 beyond the second outer bank part EB2 to the third subarea SA3. The first connection electrode CNE1 may contact the first electrode RME1 through the first contact part CT1 exposing an upper surface of the first electrode RME1 in the third subarea SA3. The first connection electrode CNE1 may contact the light emitting elements ED and the first electrode RME1 to send an electrical signal, received from the first transistor T1, to the light emitting elements ED.

A second connection electrode CNE2 may extend in the first direction DR1 and may be disposed on the second electrode RME2. A part of the second connection electrode CNE2 which is disposed on the second inner bank part IB2 may overlap the second electrode RME2, and the second connection electrode CNE2 may extend from the part in the first direction DR1 beyond the second outer bank part EB2 to the third subarea SA3. The second connection electrode CNE2 may contact the second electrode RME2 through the second contact part CT2 exposing an upper surface of the second electrode RME2 in the third subarea SA3. The second connection electrode CNE2 may contact the light emitting elements ED and the second electrode RME2 to send an electrical signal, received from the second voltage line VL2, to the light emitting elements ED.

The fourth insulating layer PAS4 is disposed on the second connection electrode CNE2 and the third insulating layer PAS3. The fourth insulating layer PAS4 may be entirely disposed on the third insulating layer PAS3 to cover (or overlap) the second connection electrode CNE2, and the first connection electrode CNE1 may be disposed on the fourth insulating layer PAS4. The fourth insulating layer PAS4 may be entirely disposed on the via layer VIA except for an area in which the first connection electrode CNE1 is disposed. For example, the fourth insulating layer PAS4 may be disposed on the bank layer BNL and the subareas SA1 to SA3 in addition to the third insulating layer PAS3. The fourth insulating layer PAS4 may insulate the first connection electrode CNE1 and the second connection electrode CNE2 from each other so that the first connection electrode CNE1 does not directly contact the second connection electrode CNE2.

In an embodiment, the fourth insulating layer PAS4 may cover (or overlap) the first hole H1 and the second hole H2 in the emission area EMA and may be disposed in the opening of the separation part ROP in the third subarea SA3. The fourth insulating layer PAS4 may directly contact a part of the upper surface of the via layer VIA in the separation part ROP of the third subarea SA3. However, similar to the third insulating layer PAS3, the fourth insulating layer PAS4 may also be disposed to expose the contact parts CT1 and CT2.

Although not illustrated in the drawings, another insulating layer may be further disposed on the fourth insulating layer PAS4 and the first connection electrode CNE1. The insulating layer may function to protect members disposed on the first substrate SUB from the external environment.

The first insulating layer PAS1, the second insulating layer PAS2, the third insulating layer PAS3, and the fourth insulating layer PAS4 described above may include an inorganic insulating material or an organic insulating material.

Figure 9:
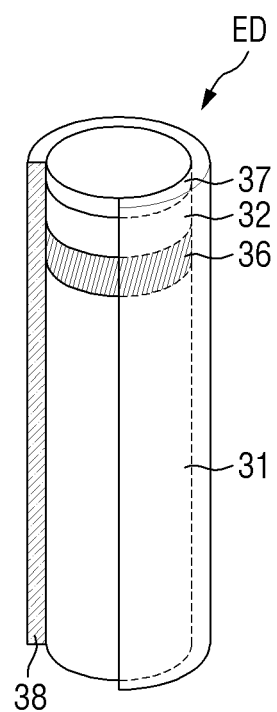
FIG. 9 is a schematic view of a light emitting element according to an embodiment.

FIG. 9 is a schematic view of a light emitting element ED according to an embodiment.

Referring to FIG. 9, the light emitting element ED may be a light emitting diode. Specifically, the light emitting element ED may be an inorganic light emitting diode having a size of nanometers to micrometers and may be made of (or include) an inorganic material. In case that an electric field is formed in a specific direction between two electrodes facing each other, the light emitting element ED may be aligned between the two electrodes in which polarities are formed.

The light emitting element ED according to the embodiment may extend in a direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped, and a hexagonal prism, and a shape extending in a direction and having a partially inclined outer surface.

The light emitting element ED may include a semiconductor layer doped with impurities of any conductivity type (e.g., a p type or an n type). The semiconductor layer may receive an electrical signal from an external power source and emit light of a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be one or more of n-type doped AlGaInN, GaN, AlGaN, InGaN, AlN, and InN. An n-type dopant used to dope the first semiconductor layer 31 may be Si, Ge, Sn, or the like.

The second semiconductor layer 32 is disposed on the first semiconductor layer 31 with the light emitting layer 36 interposed therebetween. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be one or more of p-type doped AlGaInN, GaN, AlGaN, InGaN, AlN, and InN. A p-type dopant used to dope the second semiconductor layer 32 may be Mg, Zn, Ca, Se, Ba, or the like.

Although each of the first semiconductor layer 31 and the second semiconductor layer 32 is composed of one layer in the drawing, the disclosure is not limited thereto. Each of the first semiconductor layer 31 and the second semiconductor layer 32 may also include a greater number of layers, for example, may further include a clad layer or a tensile strain barrier reducing (TSBR) layer depending on the material of the light emitting layer 36.

The light emitting layer 36 is disposed between the first semiconductor layer 31 and the second semiconductor layer 32. The light emitting layer 36 may include a material having a single or multiple quantum well structure. In case that the light emitting layer 36 includes a material having a multiple quantum well structure, it may have a structure in which quantum layers and well layers are alternately stacked. The light emitting layer 36 may emit light through combination of electron-hole pairs according to an electrical signal received through the first semiconductor layer 31 and the second semiconductor layer 32. The light emitting layer 36 may include a material such as AlGaN or AlGaInN. In case that the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked or may include different group III to V semiconductor materials depending on the wavelength band of light that it emits. Light emitted from the light emitting layer 36 is not limited to light in a blue wavelength band. In some embodiments, the light emitting layer 36 may emit light in a red or green wavelength band.

The electrode layer 37 may be an ohmic connection electrode. However, the disclosure is not limited thereto, and the electrode layer 37 may also be a Schottky connection electrode. The light emitting element ED may include at least one electrode layer 37. The light emitting element ED may include one or more electrode layers 37. However, the disclosure is not limited thereto, and the electrode layer 37 may also be omitted.

In case that the light emitting element ED is electrically connected to an electrode or a connection electrode in the display device 10, the electrode layer 37 may reduce the resistance between the light emitting element ED and the electrode or the connection electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin zinc oxide (ITZO).

The insulating film 38 surrounds outer surfaces of the semiconductor layers and the electrode layer described above. For example, the insulating film 38 may surround at least an outer surface of the light emitting layer 36 but may expose both ends of the light emitting element ED in a longitudinal direction. An upper surface of the insulating film 38 may be rounded in a cross-sectional view in an area adjacent to at least one end of the light emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), or aluminum oxide ($AlO_x$). Although the insulating film 38 is illustrated as a single layer in the drawing, the disclosure is not limited thereto. In some embodiments, the insulating film 38 may be formed in a multi-layer structure in which layers are stacked.

The insulating film 38 may protect the above members. The insulating film 38 may prevent an electrical short circuit that may occur in the light emitting layer 36 in case that the light emitting layer 36 directly contacts an electrode through which an electrical signal is transmitted to the light emitting element ED. The insulating film 38 may prevent a reduction in luminous efficiency of the light emitting element ED.

An outer surface of the insulating film 38 may be treated. Light emitting elements ED may be sprayed onto electrodes in a state where they are dispersed in an ink, and then may be aligned. Here, the surface of the insulating film 38 may be hydrophobic or hydrophilic-treated, so that each light emitting element ED remains separate from other adjacent light emitting elements ED in the ink without being agglomerated with them.

The display device 10 may include light emitting elements ED, and the light emitting elements ED may be placed in each subpixel SPXn by an inkjet printing process. Ink including the light emitting elements ED may be placed in the emission area EMA among the areas surrounded by the outer bank parts EB, and the outer bank parts EB may prevent the ink from overflowing into other subpixels SPXn. In an embodiment, each outer bank part EB of the bank layer BNL may include a plasma-treated area in a part of its upper surface in order to prevent the overflowing of the ink.

Figure 10:
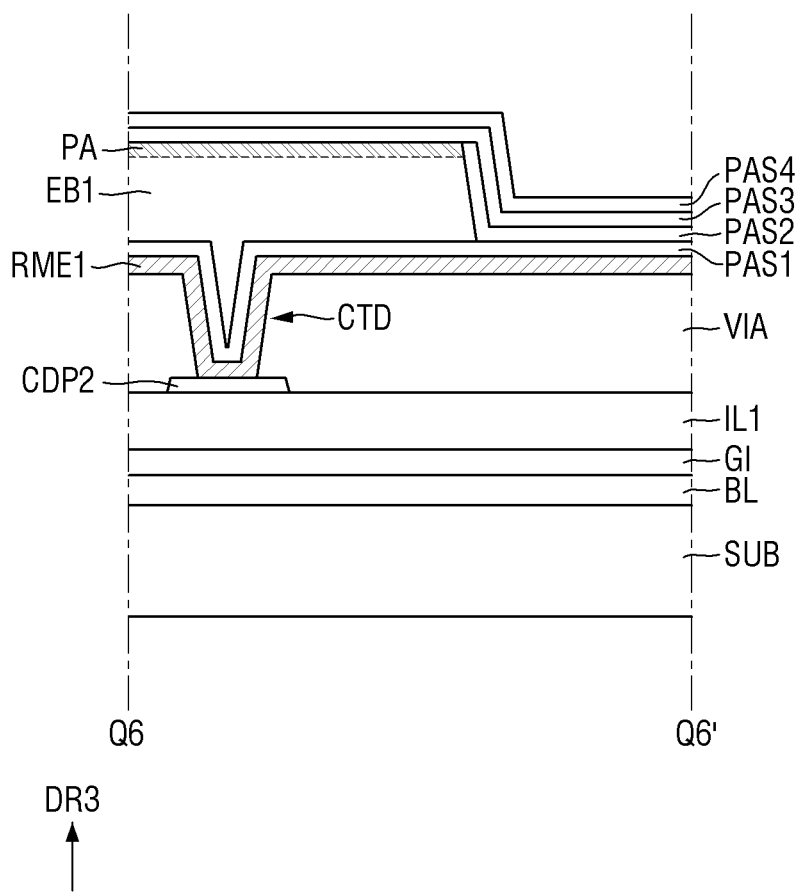
FIG. 10 is a schematic cross-sectional view taken along line Q6-Q6' of FIG. 2.

FIG. 10 is a schematic cross-sectional view taken along line Q6-Q6' of FIG. 2. FIG. 10 is a cross section taken across a part of the first electrode RME1 in the first direction DR1 and a cross section taken from the emission area EMA to a part of the first outer bank part EB1.

Referring to FIG. 10 in conjunction with FIGS. 2 to 8, according to an embodiment, the display device 10 may include a plasma area PA formed on the upper surfaces of the outer bank parts EB of the bank layer BNL on which the second insulating layer PAS2 is not disposed. The plasma area PA is an area formed by irradiating plasma to an upper surface of the bank layer BNL including an organic insulating material and may have liquid repellency compared with other parts.

In case that ink in which the light emitting elements ED are dispersed is sprayed to an area surrounded by the outer bank parts EB, the ink may settle in the area without flowing over the outer bank parts EB because of the liquid repellent property (or liquid repellency) of the plasma area PA. In an embodiment in which different types of light emitting elements ED are disposed in each subpixel SPXn, the plasma area PA formed on the upper surfaces of the outer bank parts EB may prevent inks, sprayed to different areas from flowing over the outer bank parts EB and being mixed with each other.

Irradiating plasma to the upper surface of the bank layer BNL may be performed after the second insulating layer PAS2 is formed. Since the second insulating layer PAS2 is directly disposed on the side surfaces of the outer bank parts EB while covering (or overlapping) the inner bank parts IB, it may not be disposed on the upper surfaces of the outer bank parts EB of the bank layer BNL. In case that plasma is irradiated after the second insulating layer PAS2 is formed, the plasma area PA may be selectively formed only on the upper surfaces of the outer bank parts EB of the bank layer BNL and may not be formed on upper surfaces of the inner bank parts IB. Since the plasma area PA is formed only on the outer bank parts EB surrounding the emission area EMA in which the light emitting elements ED are disposed, ink including the light emitting elements ED can be prevented from being mixed with inks landing in other subpixels SPXn and can be prevented from flowing over the first outer bank part EB1 and the second outer bank part EB2 to the third subarea SA3.

Figure 11:
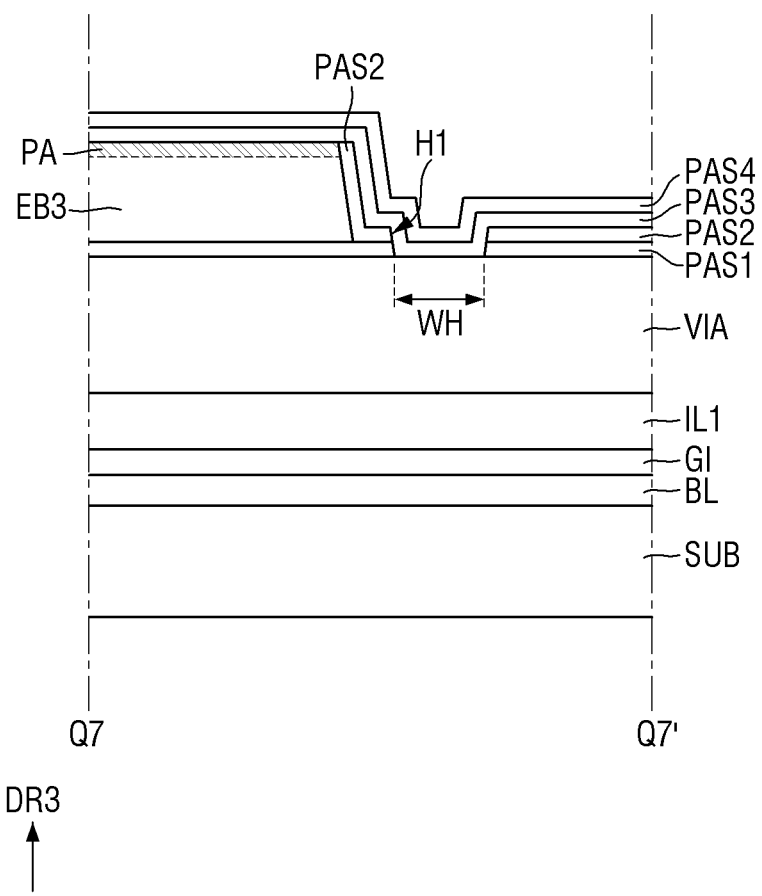
FIG. 11 is a schematic cross-sectional view taken along line Q7-Q7' of FIG. 2.

FIG. 11 is a schematic cross-sectional view taken along line Q7-Q7' of FIG. 2. FIG. 11 illustrates a cross section taken across the first hole H1 in the second direction DR2.

Referring to FIG. 11 in conjunction with FIGS. 2 to 8, the holes H1 and H2 penetrating the first insulating layer PAS1 and the second insulating layer PAS2 may be formed after the second insulating layer PAS2 is formed and before a process of placing the light emitting elements ED. For example, the first insulating layer PAS1 may be formed by entirely depositing an insulating material on the via layer VIA and then may be partially patterned in a process of forming the second insulating layer PAS2 to form the holes H1 and H2. Similarly, the contact parts CT1 and CT2 penetrating the first insulating layer PAS1 and the second insulating layer PAS2 and the opening of the separation part ROP may also be formed by partially patterning the first insulating layer PAS1 in the process of forming the second insulating layer PAS2.

After the first insulating layer PAS1 is formed to cover (or overlap) the electrodes RME, openings may be formed in the process of forming the second insulating layer PAS2 on the bank layer BNL. The first hole H1 and the second hole H2 may be paths through which gas generated from the via layer VIA is discharged, and the contact parts CT1 and CT2 may be contact parts of the connection electrodes CNE and the electrodes RME. After the light emitting elements ED are placed, a process of separating the electrodes RME may be performed in the opening of the separation part ROP. In an embodiment, the first insulating layer PAS1 and the second insulating layer PAS2 may be made of the same material, and the openings may be formed by a process of simultaneously patterning the first insulating layer PAS1 and the second insulating layer PAS2. Accordingly, inner sidewalls of the first insulating layer PAS1 and the second insulating layer PAS2 may be aligned with each other in the openings.

The bank layer BNL may include an organic insulating material, and a developer used in the process of forming the bank layer BNL may damage the electrodes RME. However, since the display device 10 according to the embodiment includes the first insulating layer PAS1 for protecting the electrodes RME, even if the electrodes RME are formed before the bank layer BNL, the electrodes RME can be prevented from being damaged by the developer.

Various embodiments of the display device 10 will now be described with further reference to other drawings.

Figure 12:
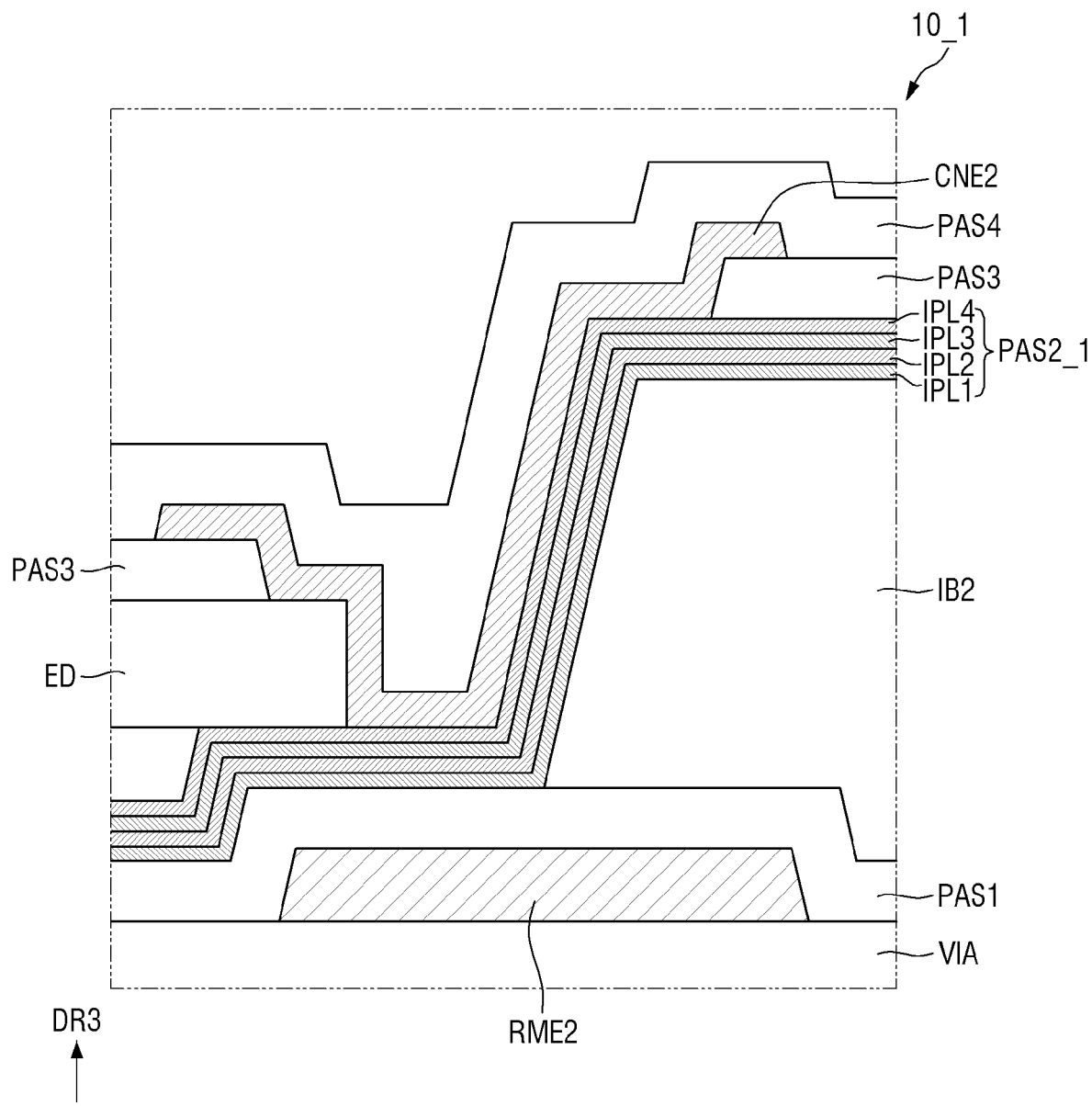
FIG. 12 is a schematic cross-sectional view illustrating the structure of a second insulating layer of a display device according to an embodiment.

FIG. 12 is a schematic cross-sectional view illustrating the structure of a second insulating layer PAS2_1 of a display device 10_1 according to an embodiment. FIG. 12 illustrates the stacked structure of the second insulating layer PAS2_1 on a side of a light emitting element ED, for example, a side of the second insulating layer PAS2_1 which contacts a second connection electrode CNE2.

Referring to FIG. 12, in the display device 10_1 according to the embodiment, the second insulating layer PAS2_1 may have a structure in which layers IPL1 to IPL4 are stacked. The second insulating layer PAS2_1 may include a first layer IPL1 and a second layer IPL2 disposed on the first layer IPL1 and made of a different material from that of the first layer IPL1. A third layer IPL3 may be disposed on the second layer IPL2 and made of a different material from that of the second layer IPL2, and a fourth layer IPL4 may be disposed on the third layer IPL3 and made of a different material from that of the third layer IPL3. At least some of the layers IPL1 to IPL4 forming the second insulating layer PAS2_1 may be made of materials having different refractive indices. For example, the first layer IPL1 may be made of a material having a different refractive index from that of the material of the second layer IPL2, and the third layer IPL3 may be made of a material having a different refractive index from that of the material of the fourth layer IPL4. In an embodiment, the first layer IPL1 and the third layer IPL3 may be made of the same material, the second layer IPL2 and the fourth layer IPL4 may be made of the same material, and the first layer IPL1 and the third layer IPL3 may be made of a material having a different refractive index from that of the material of the second layer IPL2 and the fourth layer IPL4. For example, the first layer IPL1 and the third layer IPL3 may be made of silicon nitride ($SiN_x$), and the second layer IPL2 and the fourth layer IPL4 may be made of silicon oxide ($SiO_x$).

In each light emitting element ED extending in a direction, light generated from a light emitting layer 36 may be emitted to both ends of the light emitting element ED in the extending direction. The light emitting elements ED may be disposed such that both ends thereof generally face side surfaces of inner bank parts IB. If a structure is disposed on the side surfaces of the inner bank parts IB, the output efficiency of light generated from the light emitting elements ED can be improved. The second insulating layer PAS2_1 is a layer directly disposed on the inner bank parts IB and may serve as a structure that directs light emitted from the light emitting elements ED in the upward direction. Since layers having different refractive indices are stacked in the second insulating layer PAS2_1 according to an embodiment, light emitted from the light emitting elements ED may be directed upward as it is refracted by the second insulating layer PAS2_1. Since the second insulating layer PAS2_1 is also disposed on side surfaces of outer bank parts EB, a part of light emitted from the light emitting elements ED may be refracted upward by the second insulating layer PAS2_1 disposed on the side surfaces of the outer bank parts EB. The display device 10_1 according to the embodiment may utilize the second insulating layer PAS2_1 as a structure for directing light emitted from the light emitting elements ED in the upward direction by selecting the stacked structure and material of the second insulating layer PAS2_1.

Figure 13:
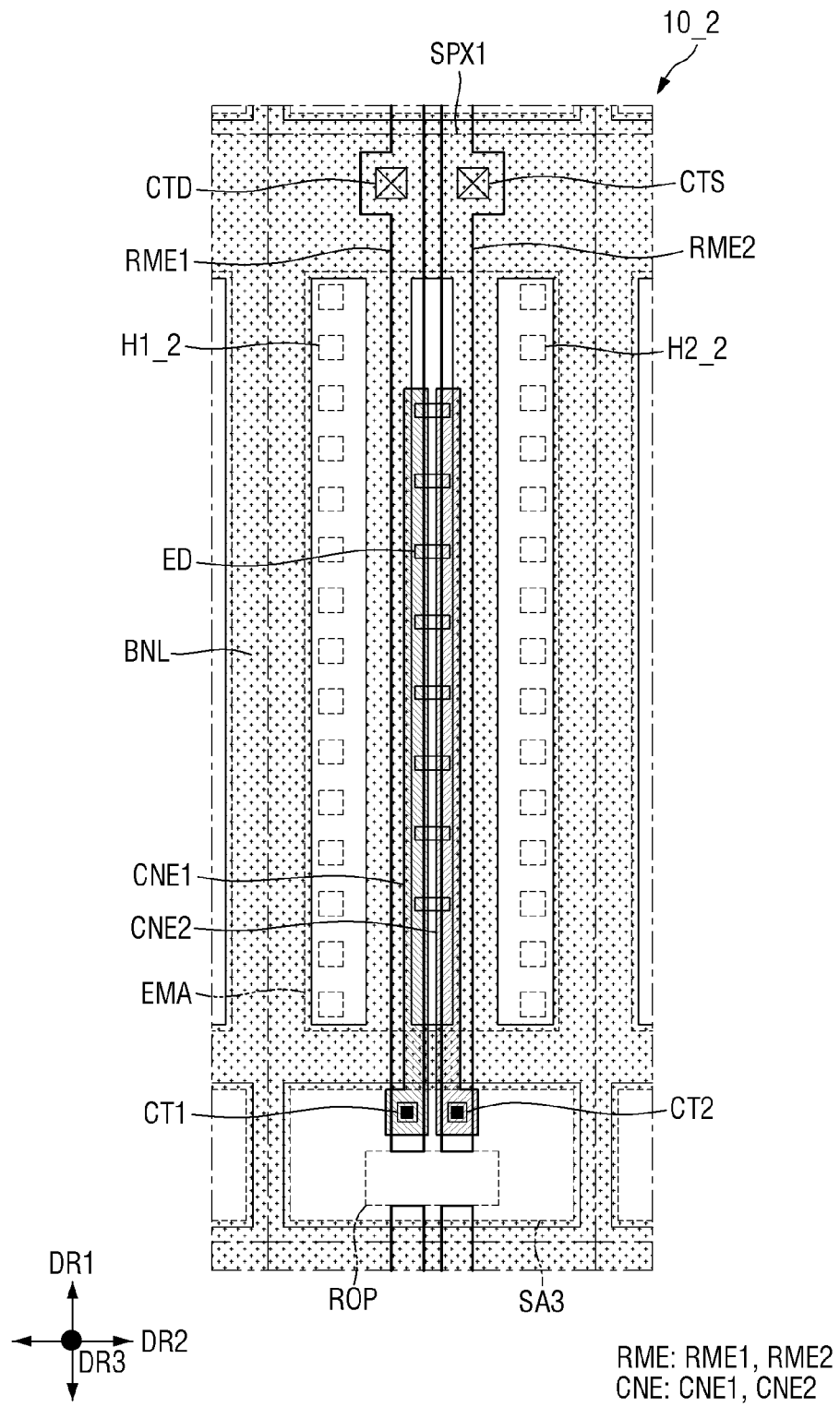
FIG. 13 is a schematic plan view of a subpixel of a display device according to an embodiment.

FIG. 13 is a schematic plan view of a subpixel of a display device 10_2 according to an embodiment.

Referring to FIG. 13, in the display device 10_2 according to the embodiment, holes H1_2 and H2_2 may not extend in a direction but may be shaped like patterns spaced apart in the direction. As described above, the holes H1_2 and H2_2 of a first subarea SA1 and a second subarea SA2 may serve (or function) as paths through which gas generated from an organic insulating material of a via layer VIA is discharged, and the planar shape and size of the holes H1_2 and H2_2 can be variously modified as long as the holes H1_2 and H2_2 penetrate a first insulating layer PAS1 and a second insulating layer PAS2. First holes H1_2 may be spaced apart from each other in the first direction DR1 in the first subarea SA1, and second holes H2_2 may be spaced apart from each other along the first direction DR1 in the second subarea SA2. In the embodiment, in a process of forming the holes H1_2 and H2_2 by patterning the first insulating layer PAS1 and the second insulating layer PAS2, a patterning process may be performed such that each hole does not extend in a direction but is formed as an island-like pattern.

Figure 14:
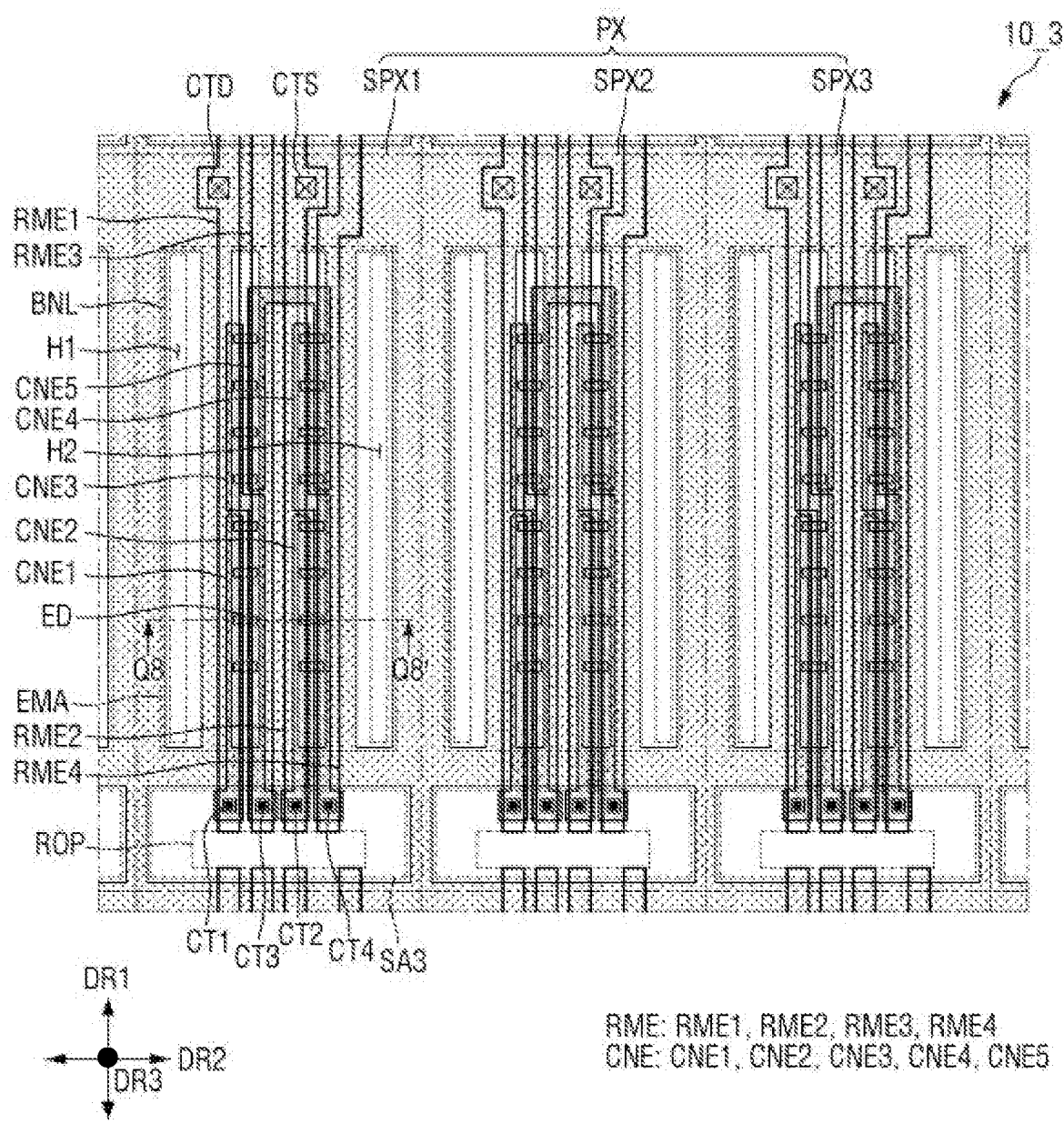
FIG. 14 is a schematic plan view of a pixel of a display device according to an embodiment.
Figure 15:
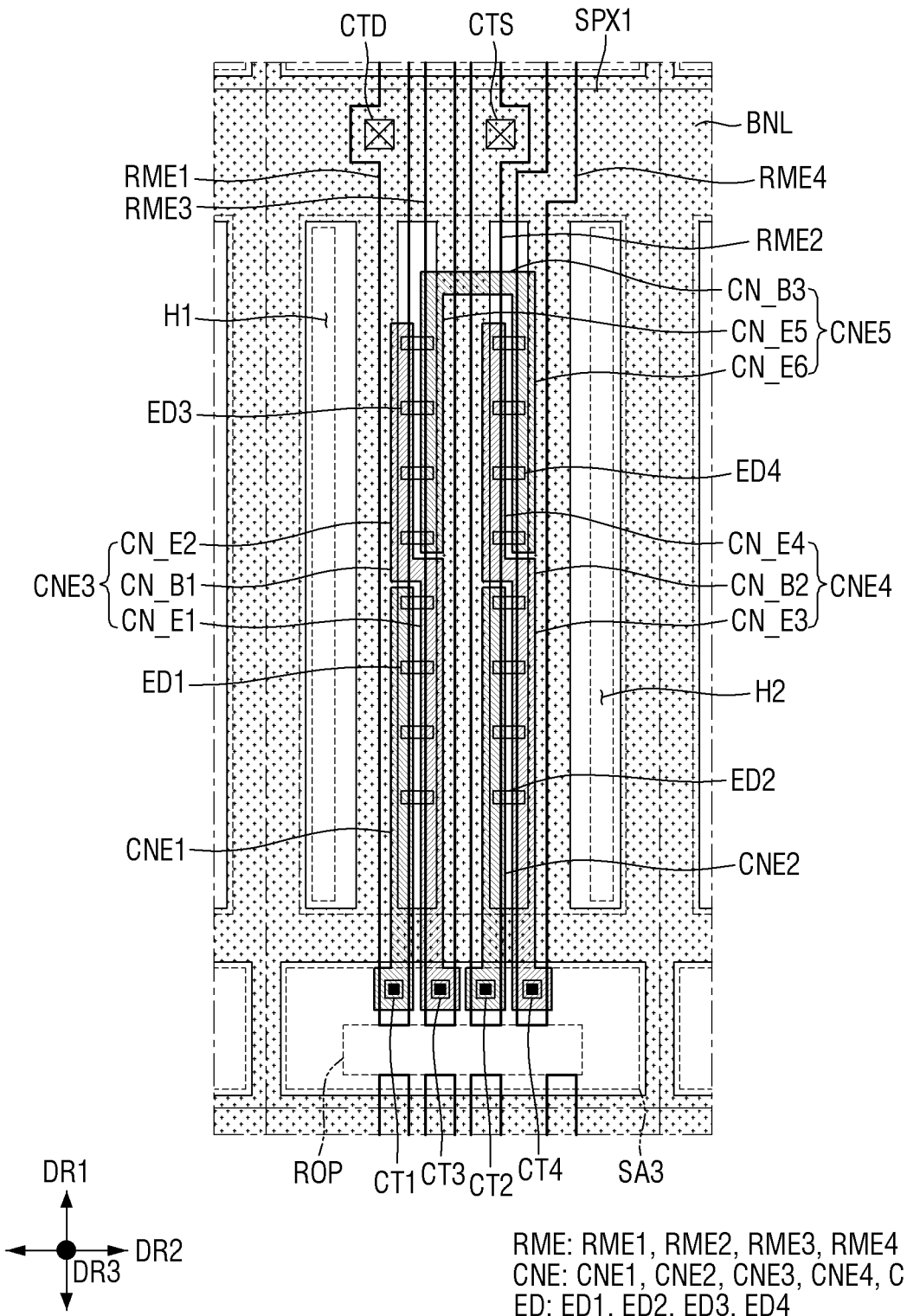
FIG. 15 is a schematic plan view of a first subpixel of FIG. 14.
Figure 16:
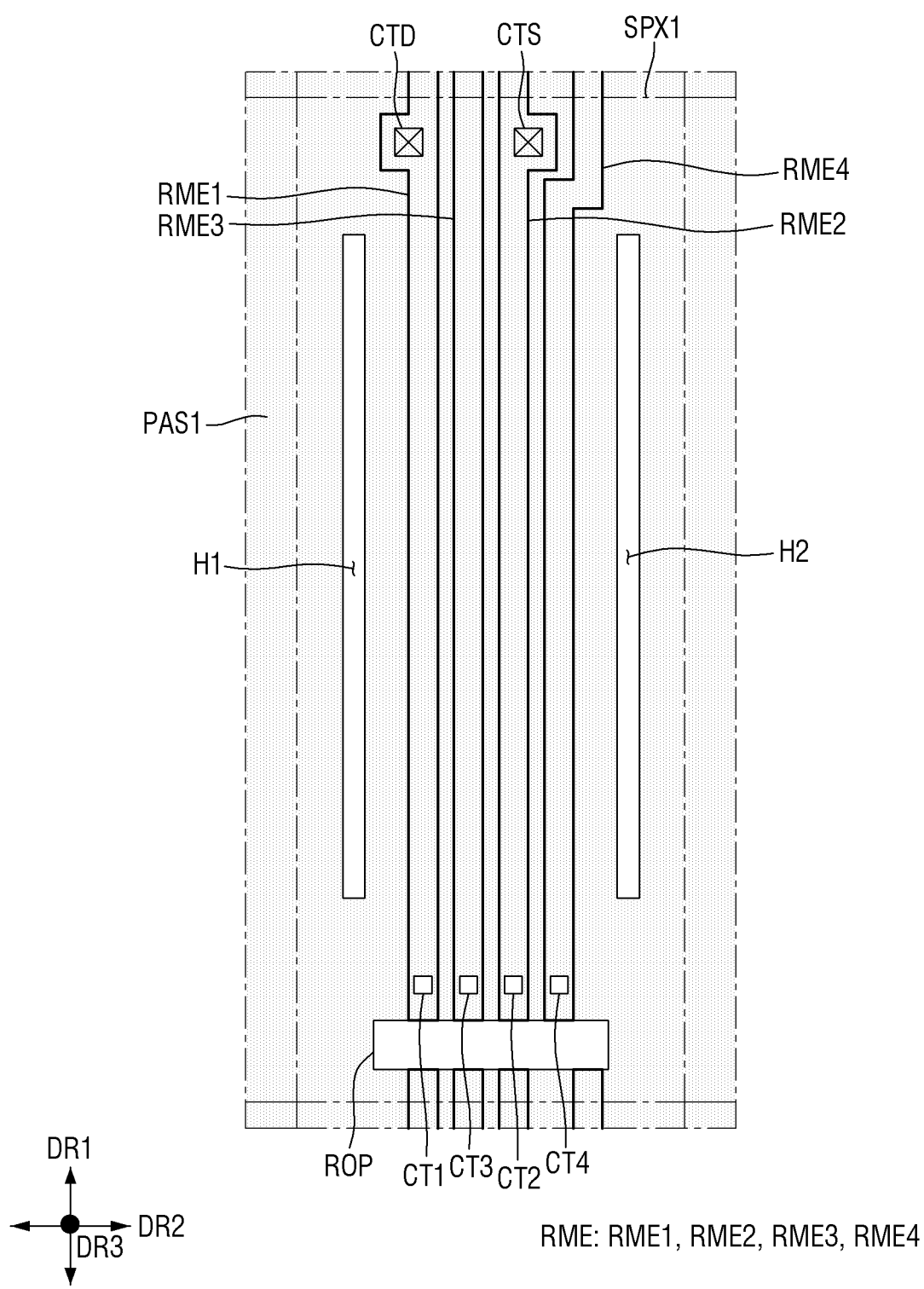
FIG. 16 is a schematic plan view illustrating the relative arrangement of electrodes and a first insulating layer in the first subpixel of FIG. 14.
Figure 17:
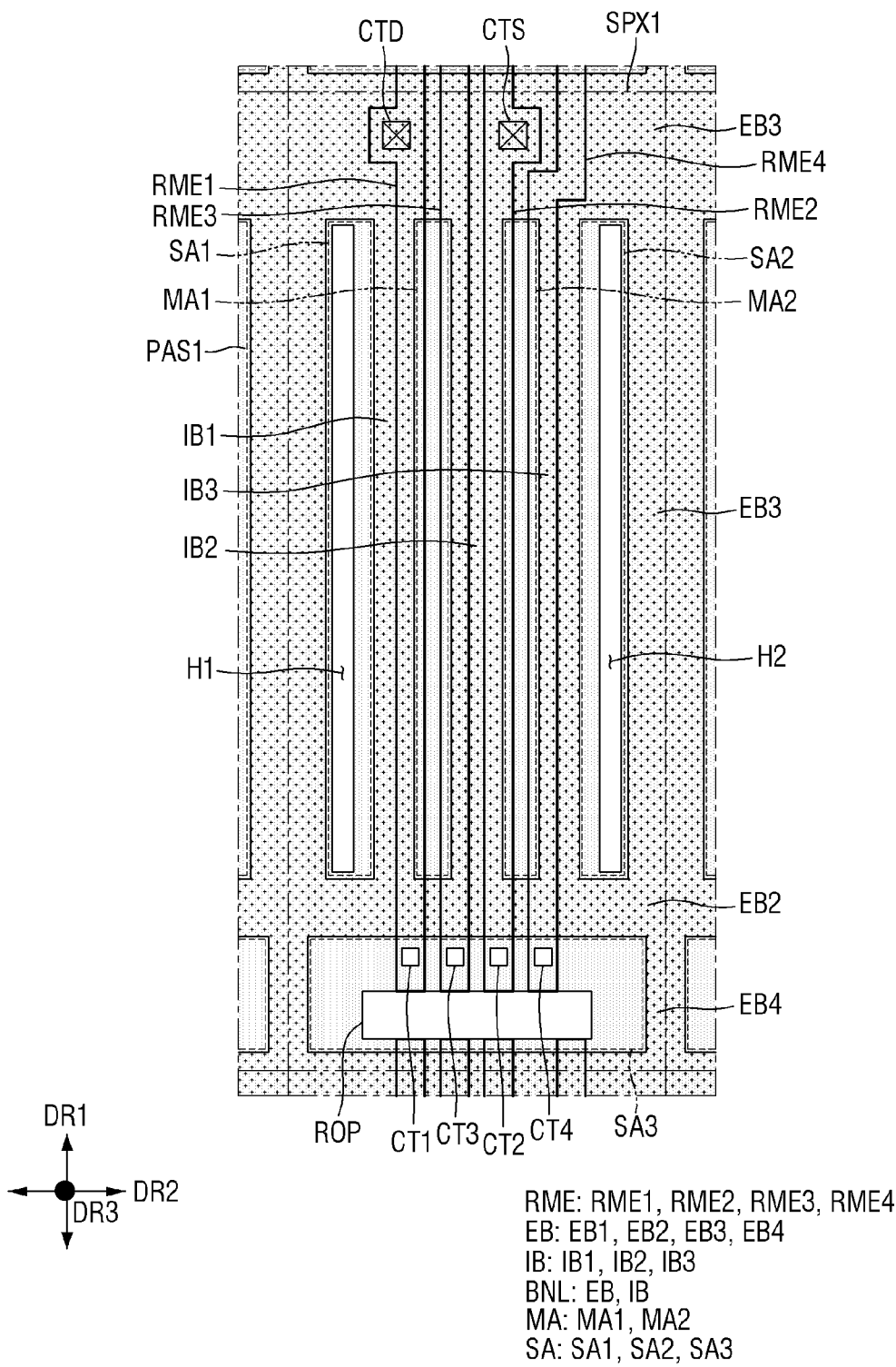
FIG. 17 is a schematic plan view illustrating the relative arrangement of the electrodes, the first insulating layer, and a bank layer in the first subpixel of FIG. 14.
Figure 18:
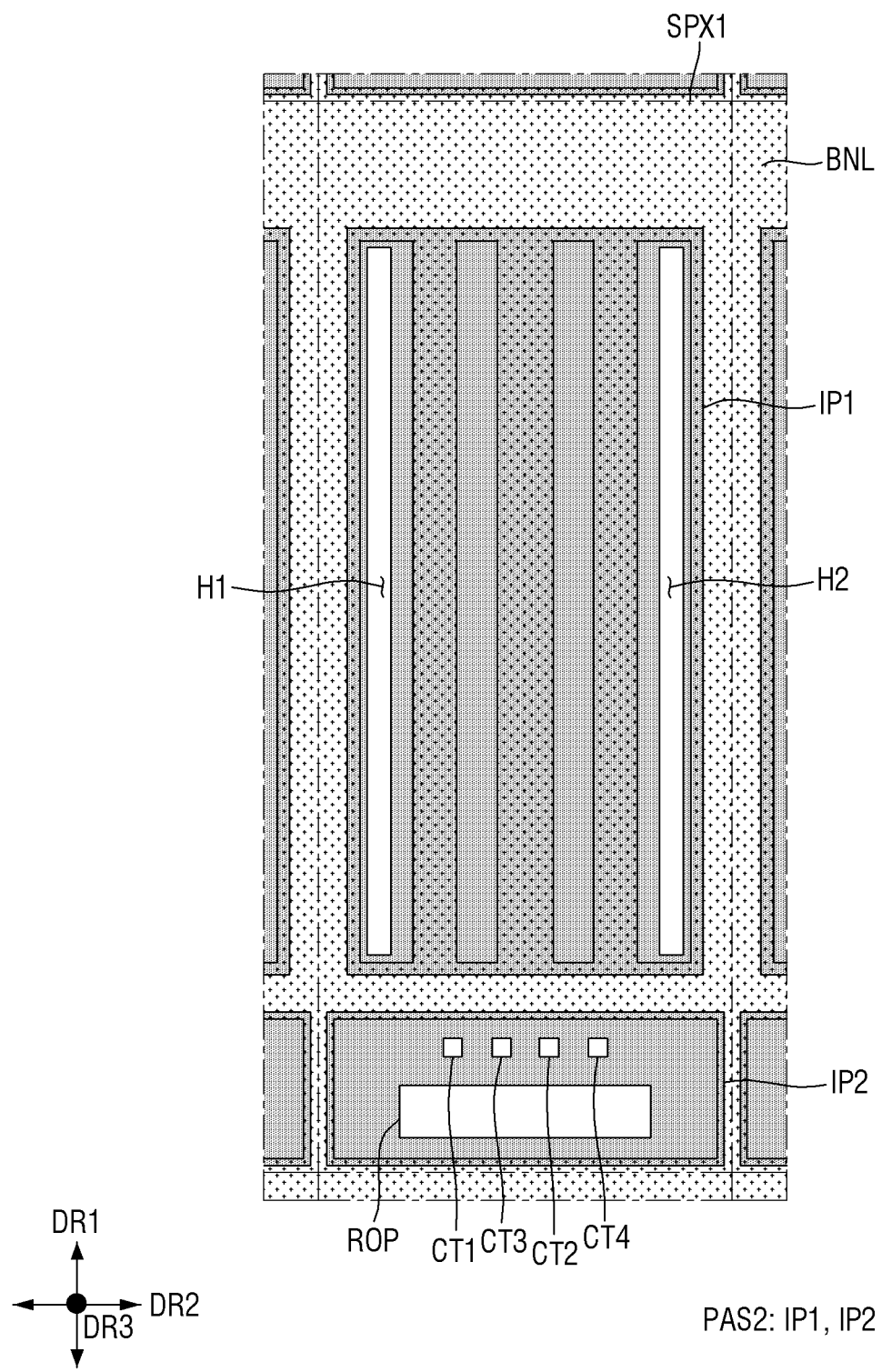
FIG. 18 is a schematic plan view illustrating the relative arrangement of the bank layer and a second insulating layer in the first subpixel of FIG. 14.
Figure 19:
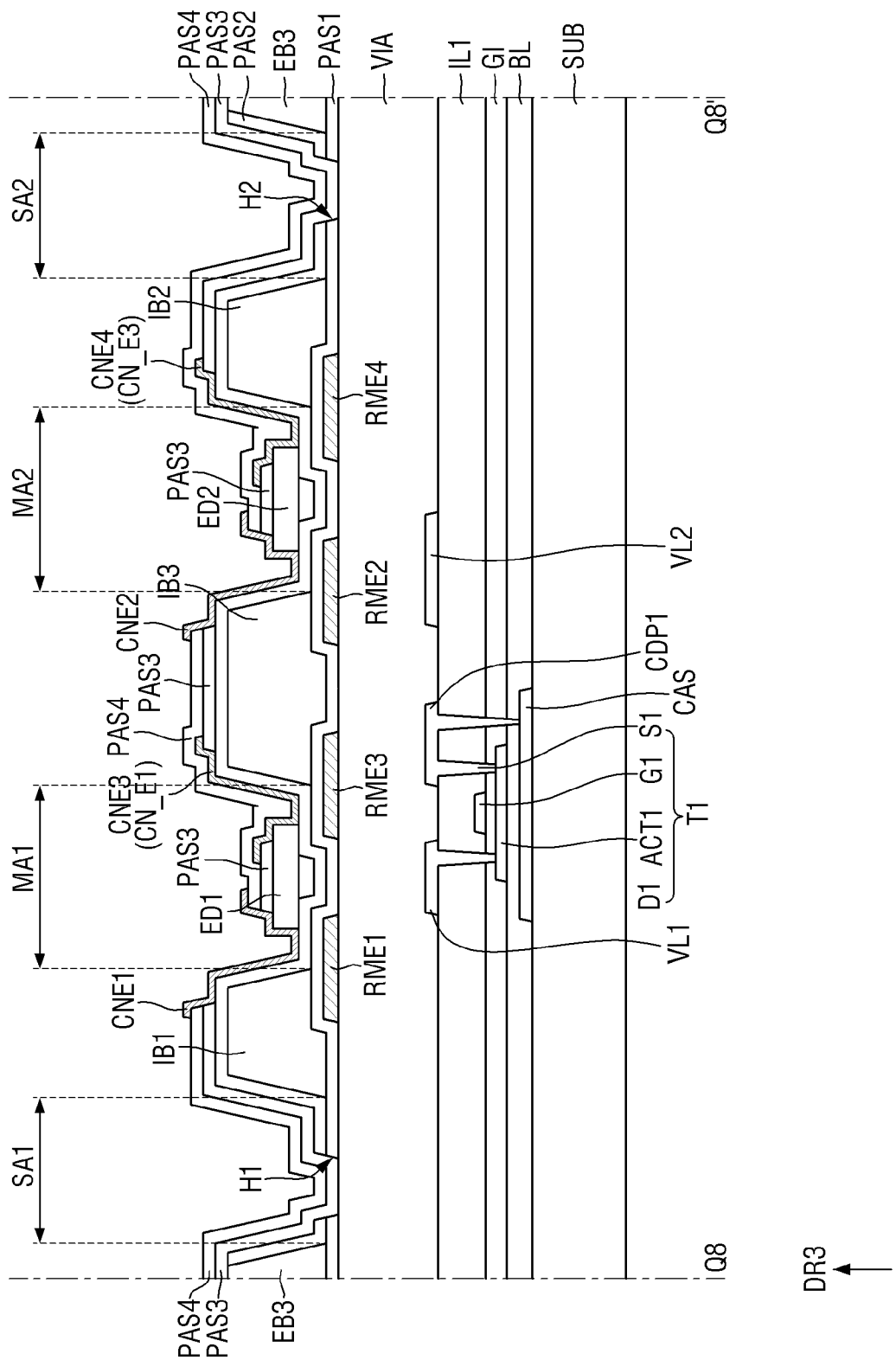
FIG. 19 is a schematic cross-sectional view taken along line Q8-Q8' of FIG. 14.

FIG. 14 is a schematic plan view of a pixel of a display device 10_3 according to an embodiment. FIG. 15 is a schematic plan view of a first subpixel of FIG. 14. FIG. 16 is a schematic plan view illustrating the relative arrangement of electrodes RME and a first insulating layer PAS1 in the first subpixel of FIG. 14. FIG. 17 is a schematic plan view illustrating the relative arrangement of the electrodes RME, the first insulating layer PAS1, and a bank layer BNL in the first subpixel of FIG. 14. FIG. 18 is a schematic plan view illustrating the relative arrangement of the bank layer BNL and a second insulating layer PAS2 in the first subpixel of FIG. 14. FIG. 19 is a schematic cross-sectional view taken along line Q8-Q8' of FIG. 14.

Referring to FIGS. 14 to 19, the display device 10_3 according to the embodiment may include a greater number of electrodes RME and a greater number of connection electrodes CNE, and a greater number of light emitting elements ED may be disposed in each subpixel SPXn. The embodiment is different from the embodiment of FIGS. 2 to 8 in the arrangement of the electrodes RME and the connection electrodes CNE in each subpixel SPXn and the arrangement of inner bank parts IB, for example, first to third inner bank parts IB1 to IB3. Thus, repetitive descriptions will be omitted, and differences will be mainly described below.

Electrodes RME disposed in each subpixel SPXn may include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 interposed therebetween. The electrodes RME may be arranged in the order of the first electrode RME1, the third electrode RME3, the second electrode RME2 and the fourth electrode RME4 from the left to right of each subpixel SPXn.

Each electrode RME may extend from an emission area EMA to a third subarea SA3 while crossing a first outer bank part EB1 and a second outer bank part EB2. Among the electrodes RME, the first electrode RME1 and the second electrode RME2 may be electrically connected to a third conductive layer thereunder through electrode contact holes CTD and CTS. However, the third electrode RME3 and the fourth electrode RME4 may not be directly electrically connected to the third conductive layer thereunder and may be electrically connected to the first electrode RME1 and the second electrode RME2 through the light emitting elements ED and the connection electrodes CNE. The first electrode RME1 and the second electrode RME2 may be first type electrodes directly electrically connected to the third conductive layer through the electrode contact holes CTD and CTS, and the third electrode RME3 and the fourth electrode RME4 may be second type electrodes not directly electrically connected to the third conductive layer. The second type electrodes may provide electrical connection paths for the light emitting elements ED together with the connection electrodes CNE.

The inner bank parts IB may further include a third inner bank part IB3 disposed between a first inner bank part IB1 and a second inner bank part IB2. Each of the first to third inner bank parts IB1 to IB3 may extend in the first direction DR1 and may be connected to the first outer bank part EB1 and the second outer bank part EB2. The first inner bank part IB1 may be disposed on the first electrode RME1, the second inner bank part IB2 may be disposed on the fourth electrode RME4, and the third inner bank part IB3 may be disposed on the second electrode RME2 and the third electrode RME3. In an embodiment, a width of the third inner bank part IB3 measured in the second direction DR2 may be greater than widths of the first inner bank part IB1 and the second inner bank part IB2. A gap between the inner bank parts IB1 to IB3 in the second direction DR2 may be greater than a gap between the first electrode RME1 and the third electrode RME3 and a gap between the second electrode RME2 and the fourth electrode RME4. Accordingly, at least a part of each electrode RME may not overlap the inner bank parts IB.

Since the bank layer BNL includes a greater number of inner bank parts IB, the emission area EMA may be divided into a greater number of areas by the inner bank parts IB and the outer bank parts EB. In an embodiment, each subpixel SPXn of the display device 103 may include a first main area MA1 between the first inner bank part IB1 and the third inner bank part IB3 and a second main area MA2 between the third inner bank part IB3 and the second inner bank part IB2. Each subpixel SPXn may include a first subarea SA1 between the first inner bank part IB1 and a third outer bank part EB3 and a second subarea SA2 between the second inner bank part IB2 and another third outer bank part EB3. In the display device 10_3, since the inner bank parts IB disposed in each subpixel SPXn further include the third inner bank part IB3, the second main area MA2 may be further included in addition to the first main area MA1.

Light emitting elements ED may be disposed in the first main area MA1 and the second main area MA2. Some of the light emitting elements ED may be disposed between the first inner bank part IB1 and the third inner bank part IB3, and the others may be disposed between the third inner bank part IB3 and the second inner bank part IB2. In an embodiment, the light emitting elements ED may include first light emitting elements ED1 and third light emitting elements ED3 disposed in the first main area MA1 and second light emitting elements ED2 and fourth light emitting elements ED4 disposed in the second main area MA2. Each of the first light emitting elements ED1 and the third light emitting elements ED3 may be disposed on the first electrode RME1 and the third electrode RME3, and each of the second light emitting elements ED2 and the fourth light emitting elements ED4 may be disposed on the second electrode RME2 and the fourth electrode RME4. The first light emitting elements ED1 and the second light emitting elements ED2 may be disposed in the emission area EMA of a corresponding subpixel SPXn to be adjacent to a lower side or the third subarea SA3, and the third light emitting elements ED3 and the fourth light emitting elements ED4 may be disposed in the emission area EMA of the corresponding subpixel SPXn to be adjacent to an upper side. However, the light emitting elements ED may be classified not according to their positions in the emission area EMA but according to their connection relationship with the connection electrodes CNE to be described below. Both ends of each light emitting element ED may contact different connection electrodes CNE according to the arrangement structure of the connection electrodes CNE, and the light emitting elements ED may be classified into different light emitting elements ED according to types of connection electrodes CNE that they contact.

The arrangement of the first insulating layer PAS1 and the second insulating layer PAS2 may be the same as that described above with reference to the embodiments of FIGS. 2 to 8. The first insulating layer PAS1 may be entirely disposed in each subpixel SPXn, and the second insulating layer PAS2 may include a first pattern part IP1 disposed in the emission area EMA and a second pattern part IP2 disposed in the third subarea SA3. Each subpixel SPXn may include a first hole H1 and a second hole H2 penetrating the first insulating layer PAS1 and the second insulating layer PAS2, an opening of a separation part ROP, and contact parts CT1 to CT4. The first hole H1 may be disposed in the first subarea SA1, the second hole H2 may be disposed in the second subarea SA2, and the opening of the separation part ROP and the contact parts CT1 to CT4 may be disposed in the third subarea SA3.

Since a greater number of electrodes RME are disposed in each subpixel SPXn, there may be a greater number of contact parts CT1 to CT4. In an embodiment, in the third subarea SA3, a third contact part CT3 disposed on the third electrode RME3 and a fourth contact part CT4 disposed on the fourth electrode RME4 may be further disposed in addition to a first contact part CT1 disposed on the first electrode RME1 and a second contact part CT2 disposed on the second electrode RME2. Each of the contact parts CT1 to CT4 may penetrate the first insulating layer PAS1 and the second pattern part IP2 of the second insulating layer PAS2 and expose a part of an upper surface of a corresponding electrode RME.

In the opening of the separation part ROP, each electrode RME may not be disposed, and an electrode RME of a corresponding subpixel SPXn may be spaced apart from an electrode RME of another subpixel SPXn neighboring in the first direction DR1.

Connection electrodes CNE may include a third connection electrode CNE3, a fourth connection electrode CNE4, and a fifth connection electrode CNE5 disposed on electrodes RME, in addition to a first connection electrode CNE1 disposed on the first electrode RME1 and a second connection electrode CNE2 disposed on the second electrode RME2.

Unlike in the embodiments of FIGS. 2 to 8, each of the first connection electrode CNE1 and the second connection electrode CNE2 may have a relatively short length in the first direction DR1. The first connection electrode CNE1 and the second connection electrode CNE2 may be disposed below the center of the emission area EMA. The first connection electrode CNE1 and the second connection electrode CNE2 may be disposed in the emission area EMA and the third subarea SA of a corresponding subpixel SPXn and may respectively contact the first electrode RME1 and the second electrode RME2 through the first contact part CT1 and the second contact part CT2 formed in the third subarea SA3.

The third connection electrode CNE3 may include a first extension part CN_E1 disposed on the third electrode RME3, a second extension part CN_E2 disposed on the first electrode RME1, and a first connection part CN_B1 electrically connecting the first extension part CN_E1 and the second extension part CN_E2. The first extension part CN_E1 may be spaced apart from the first connection electrode CNE1 in the second direction DR2 to face the first connection electrode CNE1, and the second extension part CN_E2 may be spaced apart from the first connection electrode CNE1 in the first direction DR1. The first extension part CN_E1 may be disposed on the lower side of the emission area EMA of a corresponding subpixel SPXn, and the second extension part CN_E2 may be disposed on the upper side of the emission area EMA. The first extension part CN_E1 may be disposed in the emission area EMA and the third subarea SA3 and may be connected to the third electrode RME3 through the third contact part CT3 formed in the third subarea SA3. The first connection part CN_B1 may be disposed on the first electrode RME1 and the third electrode RME3 in the center of the emission area EMA. The third connection electrode CNE3 may generally extend in the first direction DR1 but may be bent in the second direction DR2 and then may extend again in the first direction DR1.

The fourth connection electrode CNE4 may include a third extension part CN_E3 disposed on the fourth electrode RME4, a fourth extension part CN_E4 disposed on the second electrode RME2, and a second connection part CN_B2 electrically connecting the third extension part CN_E3 and the fourth extension part CN_E4. The third extension part CN_E3 may be spaced apart from the second connection electrode CNE2 in the second direction DR2 to face the second connection electrode CNE2, and the fourth extension part CN_E4 may be spaced apart from the second connection electrode CNE2 in the first direction DR1. The third extension part CN_E3 may be disposed on the lower side of the emission area EMA of a corresponding subpixel SPXn, and the fourth extension part CN_E4 may be disposed on the upper side of the emission area EMA. The third extension part CN_E3 may be disposed in the emission area EMA and the third subarea SA3 and may be electrically connected to the fourth electrode RME4 through the fourth contact part CT4. The second connection part CN_B2 may be disposed on the second electrode RME2 and the fourth electrode RME4 at a position adjacent to the center of the emission area EMA. The fourth connection electrode CNE4 may generally extend in the first direction DR1 but may be bent in the second direction DR2 and may extend again in the first direction DR1.

The fifth connection electrode CNE5 may include a fifth extension part CN_E5 disposed on the third electrode RME3, a sixth extension part CN_E6 disposed on the fourth electrode RME4, and a third connection part CN_B3 electrically connecting the fifth extension part CN_E5 and the sixth extension part CN_E6. The fifth extension part CN_E5 may be spaced apart from the second extension part CN_E2 of the third connection electrode CNE3 in the second direction DR2 to face the second extension part CN_E2, and the sixth extension part CN_E6 may be spaced apart from the fourth extension part CN_E4 of the fourth connection electrode CNE4 in the second direction DR2 to face the fourth extension part CN_E4. Each of the fifth extension part CN_E5 and the sixth extension part CN_E6 may be disposed on the upper side of the emission area EMA, and the third connection part CN_B3 may be disposed on the third electrode RME3, the second electrode RME2 and the fourth electrode RME4. The fifth connection electrode CNE5 may surround the fourth extension part CN_E4 of the fourth connection electrode CNE4 in a plan view.

The first connection electrode CNE1 and the second connection electrode CNE2 may respectively be first type connection electrodes contacting the first electrode RME1 and the second electrode RME2 directly electrically connected to the third conductive layer. The third connection electrode CNE3 and the fourth connection electrode CNE4 may be second type connection electrodes contacting the third electrode RME3 and the fourth electrode RME4 not directly electrically connected to the third conductive layer. The fifth connection electrode CNE5 may be a third type connection electrode not contacting the electrodes RME.

As described above, the light emitting elements ED may be classified into different light emitting elements ED according to the connection electrodes CNE that both ends thereof contact based on the arrangement structure of the connection electrodes CNE.

The first light emitting elements ED1 and the second light emitting elements ED2 may have first ends contacting a first type connection electrode and second ends contacting a second type connection electrode. The first light emitting elements ED1 may contact the first connection electrode CNE1 and the third connection electrode CNE3, and the second light emitting elements ED2 may contact the second connection electrode CNE2 and the fourth connection electrode CNE4. The third light emitting elements ED3 and the fourth light emitting elements ED4 may have first ends contacting a second type connection electrode and second ends contacting a third type connection electrode. The third light emitting elements ED3 may contact the third connection electrode CNE3 and the fifth connection electrode CNE5, and the fourth light emitting elements ED4 may contact the fourth connection electrode CNE4 and the fifth connection electrode CNE5.

The light emitting elements ED may be electrically connected in series to each other through the connection electrodes CNE. Since the display device 10_3 according to the embodiment includes a greater number of light emitting elements ED in each subpixel SPXn, which are electrically connected to each other in series, thereby further increasing the amount of light emitted per unit area.

Figure 20:
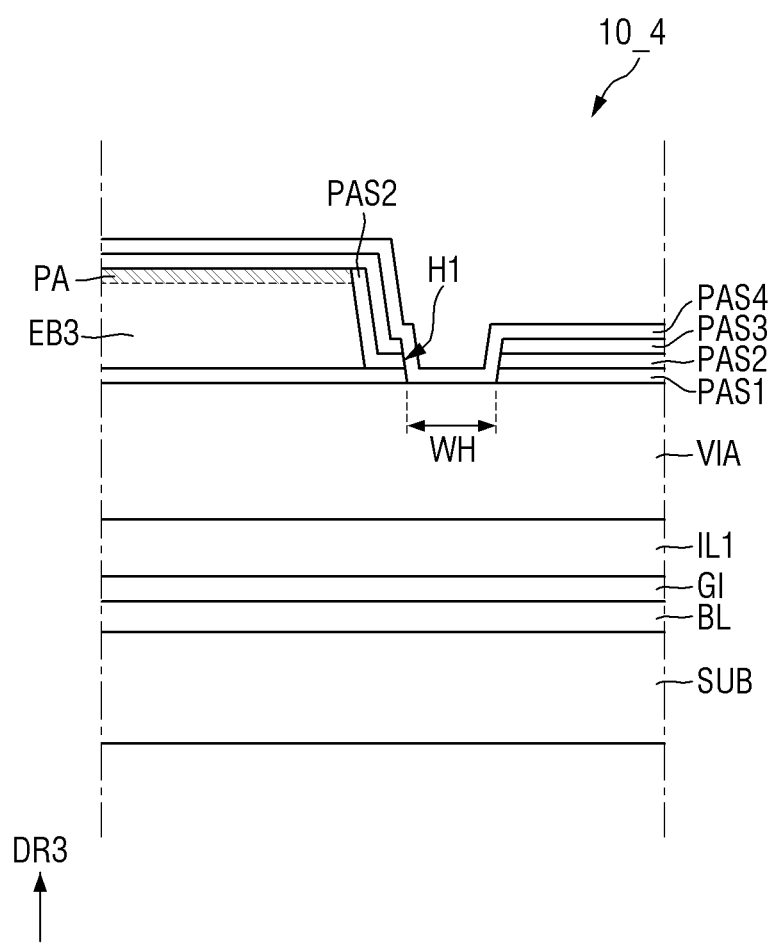
FIGS. 20 and 21 are schematic cross-sectional views illustrating holes of display devices according to embodiments.
Figure 21:
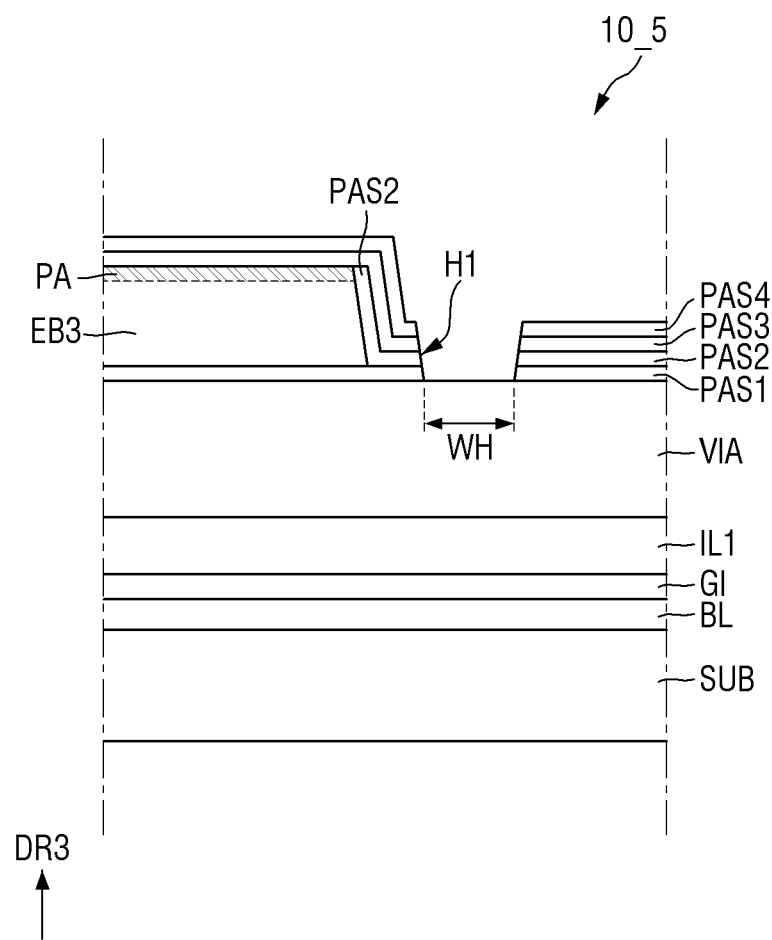

FIGS. 20 and 21 are schematic cross-sectional views illustrating holes of display devices 10_4 and 10_5 according to embodiments.

Referring to FIGS. 20 and 21, in the display devices 10_4 and 10_5 according to the embodiments, at least one of a third insulating layer PAS3 and a fourth insulating layer PAS4 may not be disposed in holes H1 and H2. In the display device 10_4 of FIG. 20, the third insulating layer PAS3 may be patterned similarly to parts of a second insulating layer PAS2 in which the holes H1 and H2 are formed, so that the third insulating layer PAS3 is not disposed in the holes H1 and H2. In the display device 10_5 of FIG. 21, each of the third insulating layer PAS3 and the fourth insulating layer PAS4 may be patterned to completely expose the holes H1 and H2 on an upper surface of a via layer VIA.

As described above, gas generated from the via layer VIA and an organic insulating material layer under the via layer VIA can fully escape through the holes H1 and H2 in a process of forming a first insulating layer PAS1 and the second insulating layer PAS2. Therefore, it does not matter even if the third insulating layer PAS3 and the fourth insulating layer PAS4 cover (or overlap) the holes H1 and H2. However, if each of the third insulating layer PAS3 and the fourth insulating layer PAS4 is patterned to expose the holes H1 and H2, gases remaining in the organic insulating material layer can completely escape.

In the embodiment of FIG. 20, each of the holes H1 and H2 may be formed to penetrate the first insulating layer PAS1, a first pattern part IP1 of the second insulating layer PAS2, and the third insulating layer PAS3, and a part of the fourth insulating layer PAS4 may be directly disposed on the upper surface of the via layer VIA exposed by the holes H1 and H2. The fourth insulating layer PAS4 may cover inner walls of the holes H1 and H2 and may cover sidewalls of the first to third insulating layers PAS1 to PAS3 exposed by the holes H1 and H2. In the embodiment of FIG. 21, each of the holes H1 and H2 may be formed to penetrate the first to fourth insulating layers PAS1 to PAS4, and parts of the upper surface of the via layer VIA on which the holes H1 and H2 are formed may be completely exposed.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a first electrode and a second electrode extending in a first direction and spaced apart from each other in a second direction;
a first insulating layer disposed on the first electrode and the second electrode;
a bank layer disposed on the first insulating layer and comprising:
an outer bank part extending in the first direction and the second direction; and
inner bank parts extending in the first direction in an area surrounded by the outer bank part;
a second insulating layer disposed on the inner bank parts and the first insulating layer; and
light emitting elements disposed on the second insulating layer between the inner bank parts, wherein
each of the inner bank parts is connected to a part of the outer bank part extending in the second direction.

2. The display device of claim 1, wherein
the inner bank parts comprise:
a first inner bank part disposed on the first electrode; and
a second inner bank part disposed on the second electrode and spaced apart from the first inner bank part in the second direction, and the second insulating layer comprises:
a first pattern part disposed in a first main area between the first inner bank part and the second inner bank part, in a first subarea between the first inner bank part and a part of the outer bank part extending in the first direction, in a second subarea between the second inner bank part and the part of the outer bank part extending in the first direction, and on the inner bank parts,
a part of the first pattern part is disposed directly on side surfaces of the outer bank part surrounding the first main area, the first subarea, and the second subarea.

3. The display device of claim 2, further comprising:
holes which penetrate the first insulating layer and the second insulating layer,
wherein the holes comprise:
a first hole disposed in the first subarea; and
a second hole disposed in the second subarea.

4. The display device of claim 3, further comprising:
a third insulating layer disposed on the bank layer, the second insulating layer, and the light emitting elements and exposing ends of each of the light emitting elements,
wherein a part of the third insulating layer is disposed in each of the first hole and the second hole.

5. The display device of claim 2, wherein a gap between the first inner bank part and the second inner bank part is greater than a gap between the first electrode and the second electrode.

6. The display device of claim 2, wherein ends of each of the light emitting elements are disposed on the first electrode and the second electrode in the first main area, respectively.

7. The display device of claim 2, further comprising:
a first electrode contact hole disposed in a part of the first electrode overlapping the part of the outer bank part extending in the second direction; and
a second electrode contact hole disposed in a part of the second electrode overlapping the part of the outer bank part extending in the second direction.

8. The display device of claim 1, further comprising:
a third subarea which is surrounded by the outer bank part and is spaced apart in the first direction from an area in which the light emitting elements are disposed, wherein
a part of the first insulating layer is disposed in the third subarea, and
the second insulating layer comprises a second pattern part disposed in the third subarea and on the side surfaces of the outer bank part surrounding the third subarea.

9. The display device of claim 8, further comprising:
a first contact part disposed in the third subarea, penetrating the first insulating layer and the second insulating layer, and exposing a part of the first electrode; and
a second contact part disposed in the third subarea, penetrating the first insulating layer and the second insulating layer, and exposing a part of the second electrode,
wherein a part of the first electrode and a part of the second electrode are disposed in the third subarea.

10. The display device of claim 9, further comprising:
a first connection electrode disposed on the first electrode, extending in the first direction, and electrically contacting the first electrode in the first contact part; and
a second connection electrode disposed on the second electrode, extending in the first direction, and electrically contacting the second electrode in the second contact part,
wherein each of the first connection electrode and the second connection electrode electrically contacts the light emitting elements.

11. The display device of claim 8, further comprising:
an opening disposed in the third subarea and penetrating the first insulating layer and the second insulating layer,
wherein the first electrode and the second electrode are not disposed in the opening.

12. The display device of claim 1, wherein the outer bank part comprises a plasma area disposed on an upper surface on which the second insulating layer is not disposed, the plasma area being an area that has liquid repellency compared with other parts the bank layer.

13. The display device of claim 1, further comprising:
a third electrode disposed between the first electrode and the second electrode; and
a fourth electrode spaced apart in the second direction from the third electrode with the second electrode disposed between the third and fourth electrodes,
wherein the inner bank parts comprise:
a first inner bank part disposed on the first electrode;
a second inner bank part disposed on the fourth electrode; and
a third inner bank part disposed on the second electrode and the third electrode between the first inner bank part and the second inner bank part.

14. The display device of claim 13, wherein the light emitting elements comprise:
first light emitting elements disposed on the first electrode and the third electrode in a first main area between the first inner bank part and the third inner bank part; and
second light emitting elements disposed on the second electrode and the fourth electrode in a second main area between the third inner bank part and the second inner bank part.

15. A display device comprising:
a first electrode and a second electrode disposed on a substrate;
a first insulating layer disposed on the first electrode and the second electrode;
a first inner bank part and a second inner bank part disposed on the first insulating layer and disposed on the first electrode and the second electrode, respectively;
an outer bank part disposed on the first insulating layer and surrounding the first inner bank part and the second inner bank part;
a second insulating layer disposed on the first insulating layer, the first inner bank part, and the second inner bank part;
light emitting elements disposed between the first inner bank part and the second inner bank part and each comprising ends, at least one of the ends being disposed on the first electrode or the second electrode;
a third insulating layer disposed on the second insulating layer and the light emitting elements, and exposing the ends of each of the light emitting elements;
a first connection electrode disposed on the first electrode and electrically contacting an end of each of the light emitting elements; and
a second connection electrode disposed on the second electrode and electrically contacting another end of each of the light emitting elements.

16. The display device of claim 15, further comprising:
holes disposed between the first and second inner bank parts and the outer bank part, and penetrating the first insulating layer and the second insulating layer,
wherein the second insulating layer is disposed in an area between the first inner bank part and the outer bank part and an area between the second inner bank part and the outer bank part.

17. The display device of claim 16, wherein the third insulating layer is disposed in the holes.

18. The display device of claim 15, wherein a part of the second insulating layer is disposed directly on side surfaces of the outer bank part.

19. The display device of claim 18, wherein the outer bank part comprises a plasma area disposed on an upper surface on which the second insulating layer is not disposed, the plasma area being an area that has liquid repellency compared with other parts the bank layer.

20. The display device of claim 15, wherein the second insulating layer comprises:
a first layer; and
a second layer disposed on the first layer and including a material having a different refractive index from a material of the first layer.

* * * * *